(12) United States Patent
Lee

(10) Patent No.: US 12,200,382 B2
(45) Date of Patent: Jan. 14, 2025

(54) IMAGE SENSING DEVICE HAVING PIXEL GROUP INCLUDING A PLURALITY OF SUB PIXELS

(71) Applicant: SK hynix Inc., Icheon-si (KR)

(72) Inventor: Won Jun Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 23 days.

(21) Appl. No.: 17/870,720

(22) Filed: Jul. 21, 2022

(65) Prior Publication Data

US 2023/0032117 A1    Feb. 2, 2023

(30) Foreign Application Priority Data

Aug. 2, 2021  (KR) .......... 10-2021-0101554
May 26, 2022  (KR) .......... 10-2022-0064862

(51) Int. Cl.
*H04N 25/77*     (2023.01)
*H01L 27/146*    (2006.01)
*H04N 25/46*     (2023.01)

(52) U.S. Cl.
CPC ....... *H04N 25/77* (2023.01); *H01L 27/14605* (2013.01); *H01L 27/14612* (2013.01); *H01L 27/14621* (2013.01); *H04N 25/46* (2023.01)

(58) Field of Classification Search
CPC ...................................... H04N 25/77
USPC ........................................... 345/207
See application file for complete search history.

(56) References Cited

U.S. PATENT DOCUMENTS

| | | |
|---|---|---|
| 9,888,198 B2 | 2/2018 | Mauritzson et al. |
| 2013/0161701 A1 | 6/2013 | Tashiro et al. |
| 2013/0221410 A1 | 8/2013 | Ahn |
| 2015/0350583 A1* | 12/2015 | Mauritzson ....... H01L 27/14647 257/432 |
| 2017/0323912 A1 | 11/2017 | Lahav et al. |
| 2021/0136303 A1* | 5/2021 | Kim ..................... H04N 25/778 |

FOREIGN PATENT DOCUMENTS

CN    112351227 A    2/2021

OTHER PUBLICATIONS

Liu, C. et al., "Design of High Sensitivity CMOS Image Sensor Based on 4T Pixel Structure." Semiconductor Optoelectronics, vol. 34, No. 3, Jun. 2013, 4 pages.

* cited by examiner

*Primary Examiner* — Long D Pham
(74) *Attorney, Agent, or Firm* — Perkins Coie LLP

(57) ABSTRACT

An image sensing device may include one or more pixel groups arranged in rows and columns in an array, each pixel group being arranged at an intersection between a row and a column of the array, wherein each pixel group comprises one or more floating diffusion regions, and one or more groups of an odd number photoelectric conversion units structured to convert incident light to generate electrical charge, each group of the odd number of photoelectric conversion units electrically connected in common to one of the floating diffusion regions for receiving the generated electrical charge.

20 Claims, 16 Drawing Sheets

IMAGE SENSING DEVICE HAVING PIXEL GROUP INCLUDING A PLURALITY OF SUB PIXELS

CROSS-REFERENCES TO RELATED APPLICATION

This patent document claims the priority and benefits of Korean application number 10-2021-0101554 filed on Aug. 2, 2021, and Korean application number 10-2022-0064862 filed on May 26, 2022. The entire contents of each of the above-referenced applications are incorporated by reference in this document in their entirety.

TECHNICAL FIELD

The technology and implementations disclosed in this patent document generally relate to an image sensing device, and more particularly to an imaging sensing device including image sensing pixels that are grouped into sub-pixel groups.

BACKGROUND

An imaging sensing device is used in electronic devices to convert optical images into electrical signals. With the recent development of automotive, medical, computer and communication industries, the demand for high-performance image sensors has been increasing in various electronic devices such as smart phones, digital cameras, camcorders, personal communication systems (PCS), game devices, security cameras, medical micro-cameras, robots, and UV sensing devices.

CMOS image sensing devices can convert optical images into electrical signals using simple circuits. In addition, CMOS image sensing devices are fabricated using the CMOS fabrication technology, and thus CMOS image sensors and other signal processing circuitry can be integrated into a single chip, enabling the production of miniaturized CMOS image sensing devices, low power consumption image sensors at a lower cost.

SUMMARY

In some embodiments, an image sensing device may include one or more pixel groups arranged in rows and columns in an array, each pixel group being arranged at an intersection between a row and a column of the array, wherein each pixel group comprises one or more floating diffusion regions, and one or more groups of an odd number photoelectric conversion units structured to convert incident light to generate electrical charge, each group of the odd number of photoelectric conversion units electrically connected in common to one of the floating diffusion regions for receiving the generated electrical charge.

In some embodiments, each pixel group includes an even number of floating diffusion regions electrically connected with each other.

In some embodiments, each of the rows in the array includes at least three sub-rows adjacent to each other, and each of the columns in the array includes at least one sub-column, wherein each pixel group includes a plurality of sub-pixels, each sub-pixel arranged at an intersection of the sub-rows and the sub-column.

In some embodiments, each sub-pixel includes one of the photoelectric conversion units.

In some embodiments, adjacent three sub-pixels coupled in common to a floating diffusion region adjoin at the floating diffusion region.

In some embodiments, each sub-pixel includes a transfer transistor, wherein a gate electrode of the transfer transistor is arranged between the photoelectric conversion unit and the floating diffusion, and electric charges generated in the photoelectric conversion unit are transferred to the floating diffusion in response to a gate signal applied to the gate electrode of the transfer transistor.

In some embodiments, the image sensing device further includes a color filter having a size corresponding to a size of the pixel group.

In some embodiments, a pixel signal generation circuit generates a pixel output signal corresponding to the one or more pixel groups, and the pixel output signal has a value that is determined based on a sum of the electric charges generated by the photoelectric conversion units in the one or more pixel groups.

In some embodiments, an image sensing device may include a substrate having a first surface and a second surface opposite to the first surface, a pixel group including first to ninth sub-pixels arranged at intersections between first to third sub-columns and first to third sub-rows intersecting each other and each sub-pixel structured and operable to convert received light into electrical charge, wherein the first to third sub-pixels are arranged on the first sub-column, the fourth to sixth sub-pixels are arranged on the second sub-column, and the seventh to ninth sub-pixels are arranged on the third sub-column, a first floating diffusion region arranged at a first location and connected to the first, second, fourth and fifth sub-pixels to receive electrical charge from the first, second, fourth and fifth sub-pixels, a second floating diffusion region arranged at a second location and connected to the second, third, fifth and sixth sub-pixels to receive electrical charge from the second, third, fifth and sixth sub-pixels, a third floating diffusion region arranged at a third location between the seventh and eighth sub-pixels, the third location and the first location are arranged symmetrically with the first floating diffusion region with respect to a boundary between the second sub-column and the third sub-column, and a fourth floating diffusion region arranged at a fourth location between the eighth and ninth sub-pixels, the fourth location and the second location are arranged symmetrically with the second floating diffusion with respect to a boundary between the second sub-column and the third sub-column, wherein each of the first to ninth sub-pixel comprises a transfer gate arranged to surround any one of the first to fourth floating diffusion regions, and a photoelectric conversion unit structured to convert received light into electrical charge and arranged adjacent to one side of the transfer gate, wherein each of the first to fourth floating diffusion regions is surrounded by three transfer gates.

In some embodiments, the second floating diffusion region is surrounded by a third transfer gate in the third sub-pixel, a fifth transfer gate in the fifth sub-pixel and a sixth transfer gate in the sixth sub-pixel.

In some embodiments, the third floating diffusion region is surrounded by a seventh transfer gate in the seventh sub-pixel and an eighth transfer gate in the eighth sub-pixel and the fourth floating diffusion region is surrounded by a ninth transfer gate in the ninth sub-pixel.

In some embodiments, the third floating diffusion region is surrounded by a seventh transfer gate in the seventh sub-pixel and the fourth floating diffusion region is surrounded by an eighth transfer gate in the eighth sub-pixel and a ninth transfer gate in the ninth sub-pixel.

In some embodiments, the transfer gates on the first to third sub-pixels of the first sub-column have a shape substantially identical to a shape of the transfer gates on the seventh to ninth sub-pixels of the third sub-column.

In some embodiments, the transfer gates on the fourth to six sub-pixels of the second sub-column have a shape symmetrical with a shape of the transfer gates on the seventh to ninth sub-pixels of the third sub-column with respect to a boundary between the second sub-column and the third sub-column.

In some embodiments, the first to fourth floating diffusion regions are electrically connected with each other.

In some embodiments, a pixel signal generation circuit disposed outside the pixel group, wherein the pixel signal generation circuit generates a pixel output signal based on an amount of electric charges generated by the first to fourth floating diffusion regions.

In some embodiments, the pixel signal generation circuit comprises a first active region positioned in a region outside any one of a first sub-row, which includes the first, fourth and seventh sub-pixels, and a third sub-row, which includes the third, sixth and ninth sub-pixels, a second active region positioned in a region outside a remaining one of the first and third sub-rows, a reset transistor and a dual conversion transistor arranged in the first active region to share a junction region with each other, and a drive transistor and a selection transistor arranged in the second active region to share a junction region with each other, wherein the drive transistor is turned-on based on the amount of the electric charges.

In some embodiments, the first active region, the first to ninth sub-pixels of the pixel group and the second active region are electrically isolated from each other by at least one isolation structure in the substrate, and any one of the isolation structures is extended to the second surface of the substrate.

In some embodiments, the image sensing device further includes a color filter arranged on the second surface of the substrate and having a size corresponding to a size of the pixel group.

In some example embodiments, an image sensing device may include one or more pixel groups arranged in rows and columns in an array, each pixel group being arranged at an intersection between a row and a column of the array. Each pixel group may include one or more floating diffusion regions and one or more groups of N structured to detect incident light to generate electrical signals corresponding to an intensity of the incident light, each group of N photoelectric conversion units electrically connected in common to one of the floating diffusion regions, wherein N is an odd number greater than one.

In example embodiments, each pixel group may include an even number of floating diffusion regions. The floating diffusions (floating diffusion regions) may be electrically connected with each other.

In example embodiments, the row may be classified into at least three sub-rows. The column may be classified into at least one sub-column. Thus, the pixel group may be defined by a plurality of sub-pixels connected to an intersection between the sub-row and the sub-column.

In example embodiments, the photoelectric conversion units may be formed at the sub-pixels, respectively. The floating diffusion may be arranged between the at least three sub-pixels. A gate of a transfer transistor may be arranged between the photoelectric conversion unit and the adjacent floating diffusion.

In example embodiments, the image sensing device may further include a pixel signal generation circuit configured to generate a pixel output signal of the at least one pixel group. The pixel output signal may be determined based on a summed value of a charge amount generated by the photoelectric conversion unit in the at least one pixel group.

According to example embodiments, there may be provided an image sensing device. The image sensing device may include a substrate, an expanded pixel group, a first floating diffusion, a second floating diffusion, a third floating diffusion and a fourth floating diffusion. The substrate may have a first surface and a second surface opposite to the first surface. The expanded pixel group includes first to ninth sub-pixels arranged between first to third sub-columns and first to third sub-rows which are intersected each other. The first to third sub-pixels are arranged on the first sub-column, the fourth to sixth sub-pixels are arranged on the second sub-column, and the seventh to ninth sub-pixels are arranged on the third-column. The first floating diffusion is arranged at contact points between the first, second, fourth and fifth sub-pixels. The second floating diffusion is arranged at contact points between second, third, fifth and sixth sub-pixels. The third floating diffusion is arranged at a contact point between the seventh and eighth sub-pixels symmetrically with respect to a boundary between the second sub-column and the third sub-column. Each of the first to ninth sub-pixel comprises a transfer gate and a photoelectric conversion unit. The transfer gate is configured to surround any one of the first to fourth floating diffusions. The photoelectric conversion unit is arranged in the sub-pixel on one side of the transfer gate. Each of the first to fourth floating diffusions is surrounded by the three transfer gates.

In example embodiments, the transfer gates on the first to third sub-pixels of the first sub-column may have a shape substantially the same as a shape of the transfer gates on the seventh to ninth sub-pixels of the third sub-column.

In example embodiments, the transfer gates on the fourth and fifth sub-pixels of the second sub-column may have a shape substantially the same as a shape of the transfer gates on the seventh to ninth sub-pixels of the third sub-column.

In example embodiments, the transfer gates on the fourth and fifth sub-pixels of the second sub-column may be symmetrical with the transfer gates on the seventh to ninth sub-pixels of the third sub-column with respect to a boundary between the second and third sub-columns.

In example embodiments, the first to fourth floating diffusions may be electrically connected with each other.

In example embodiments, the image sensing device may further include a pixel signal generation circuit integrated outside the expanded pixel group. The pixel signal generation circuit may generate a pixel output signal based on a charge amount generated by the first to fourth floating diffusions.

In example embodiments, the image sensing device may further include an expanded color filter arranged on the second surface of the substrate. The expanded color filter may have a size corresponding to a size of the expanded pixel group.

According to example embodiments, an area of the pixel group may be controlled regardless of numbers of the pixel groups corresponding to one color filter. Further, although even or odd numbers of sub-pixels may form a group corresponding to one color filter, a receiving area of a light in every direction may be uniform. Furthermore, the charges of the various sub-pixels may be summed using a binning mode to improve a signal to noise ratio (SNR) and image quality at night photographing.

DETAILED DESCRIPTION

Figure 1:
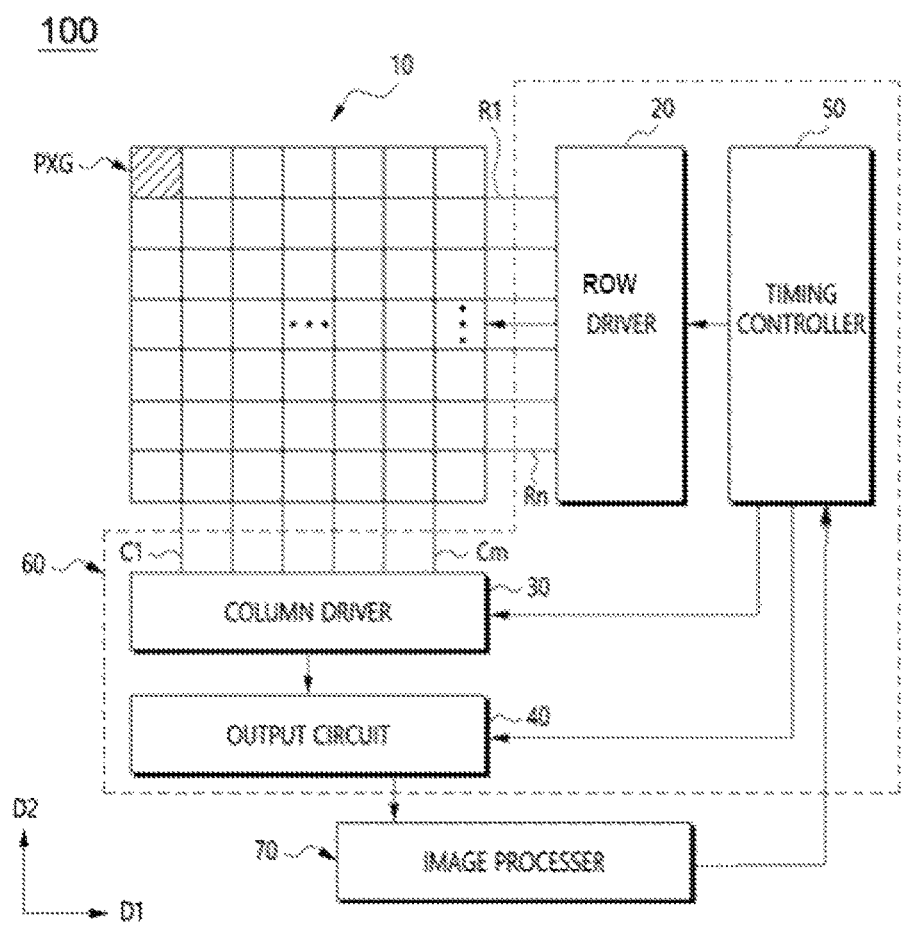
FIG. 1 is a block diagram illustrating an image sensing device in accordance with example embodiments.

Various embodiments of the disclosed technology will be described with reference to the accompanying drawings. The drawings are schematic illustrations of various embodiments (and intermediate structures). As such, modifications and variations from what is illustrated in the drawings may be made.

Although various embodiments will be described for illustrative purposes, modifications of the disclosed embodiments and other embodiments may be made based on the technology disclosed in this patent document.

FIG. 1 is a block diagram illustrating an image sensing device in accordance with example embodiments.

Referring to FIG. 1, an image sensing device 100 may include a pixel array 10 and a control circuit block 60.

The pixel array 10 may include a plurality of row lines, a plurality of column lines and a plurality of pixel groups PXG. In example embodiments, the row lines R1-Rn may be in parallel arranged in a first direction D1 and arranged in the second direction D2. The column lines C1-Cm may be extended in a second direction D2. The first direction D1 may be substantially perpendicular to the second direction D2. The plurality of pixel groups PXG may be positioned between the row lines R1-Rn and the column lines C1-Cm, respectively. The pixel groups PXG connected to the same row lines R1-Rn may be simultaneously exposed to an incident light. A pixel output signal of the pixel group PXG connected to a selected column line may be transmitted to the control circuit block 60 through the selected column line.

Each of the pixel groups PXG may include at least one photoelectric conversion unit (not shown). The pixel group PXG may correspond to at least one color filter. The photoelectric conversion unit may convert incident light from an object into electrical charge to be detected and represented by an electrical signal. The photoelectric conversion unit may receive the light from the object to generate a charge corresponding to an amount of the received light. The pixel group PXG will be discussed in detail below.

The control circuit block 60 may include a row driver 20, a column driver 30, an output circuit 40 and a timing controller 50.

The row driver 20 may control the plurality of row lines R1-Rn. The row driver 20 may generate various control signals to sequentially select the row lines R1-Rn.

The column driver 30 may control the plurality of column lines C1-Cm. The column driver 30 may generate various control signals for selecting one of the column lines C1-Cm. Further, the column driver 30 may include a correlated double sampler (not shown) and an analog-to-digital converter (not shown). The correlated double sampler may detect a pixel output signal indicative of the electrical charge produced in response to received incident light at a respective pixel group PXG or a pixel output voltage of the pixel group PXG connected between a selected row line and a selected column line using the correlated double sampler. The analog-to-digital converter may convert the pixel output signal of the selected pixel group PXG into a digital signal. The digital signal may then be transmitted to the output circuit 40.

The output circuit 40 may include a latch or a buffer that can hold or temporarily store the digital signal. The output circuit 40 may include an amplification circuit configured to amplify the digital signal. Further, the output circuit 40 may temporarily store the digital signal received from the column driver 30. The output circuit 40 may generate image data based on the buffered digital signal.

The timing controller 50 may provide the row driver 20, the column driver 30 and the output circuit 40 with timing control signals for determining operation timings of the row driver 20, the column driver 30 and the output circuit 40. The timing controller 50 may receive a control command provided from outside. The timing controller 50 may generate the timing control signals based on the control command.

The control command may be provided from an image processor 70 located external to the image sensing device 100. The image processor 70 may process the image data transmitted from the output circuit 40. The image processor 70 may output the processed image data to a display device or to a storage device for storing the image data.

Figure 2A:
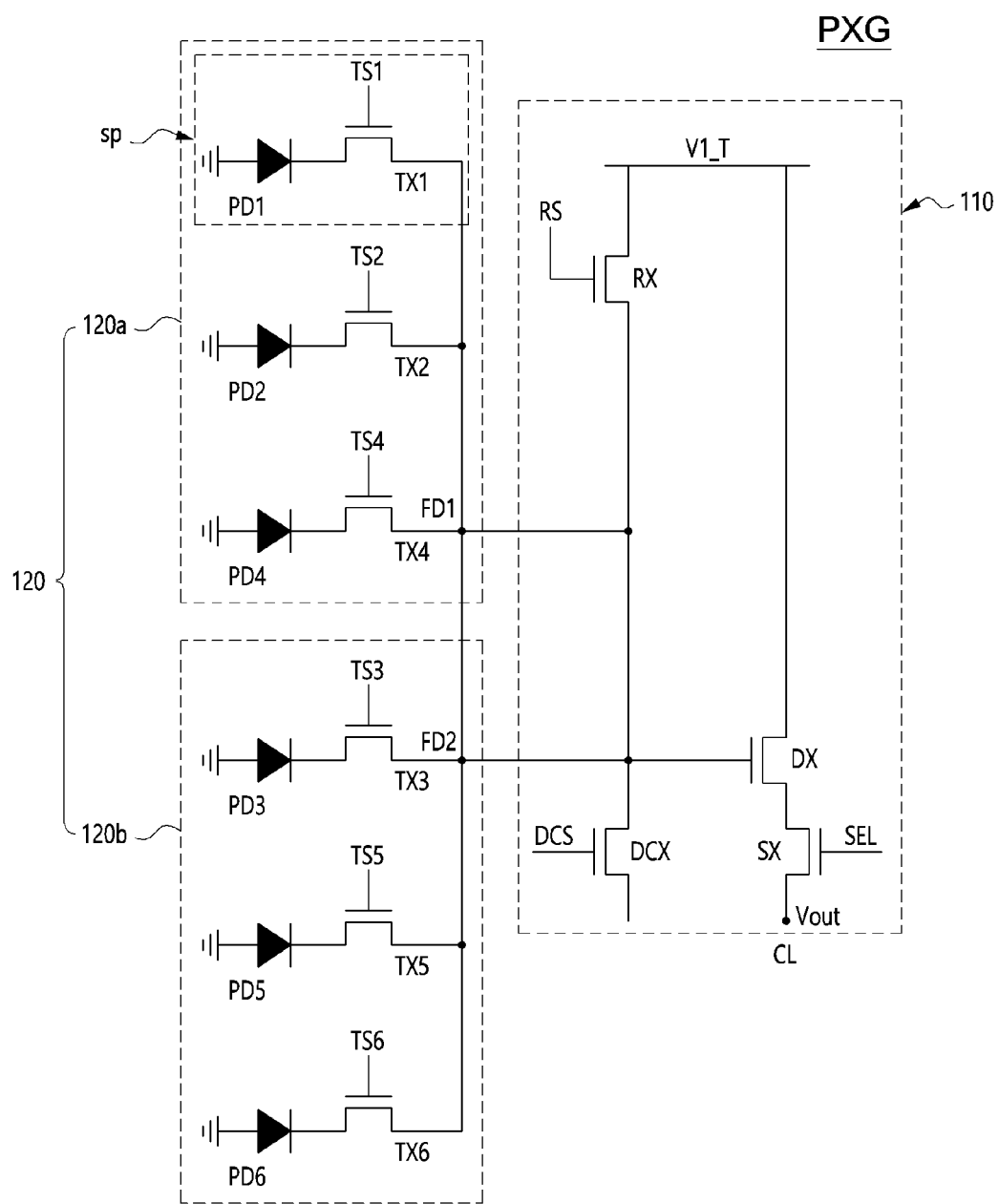
FIGS. 2A and 2B are equivalent circuit diagrams illustrating a pixel group in accordance with example embodiments.
Figure 2B:
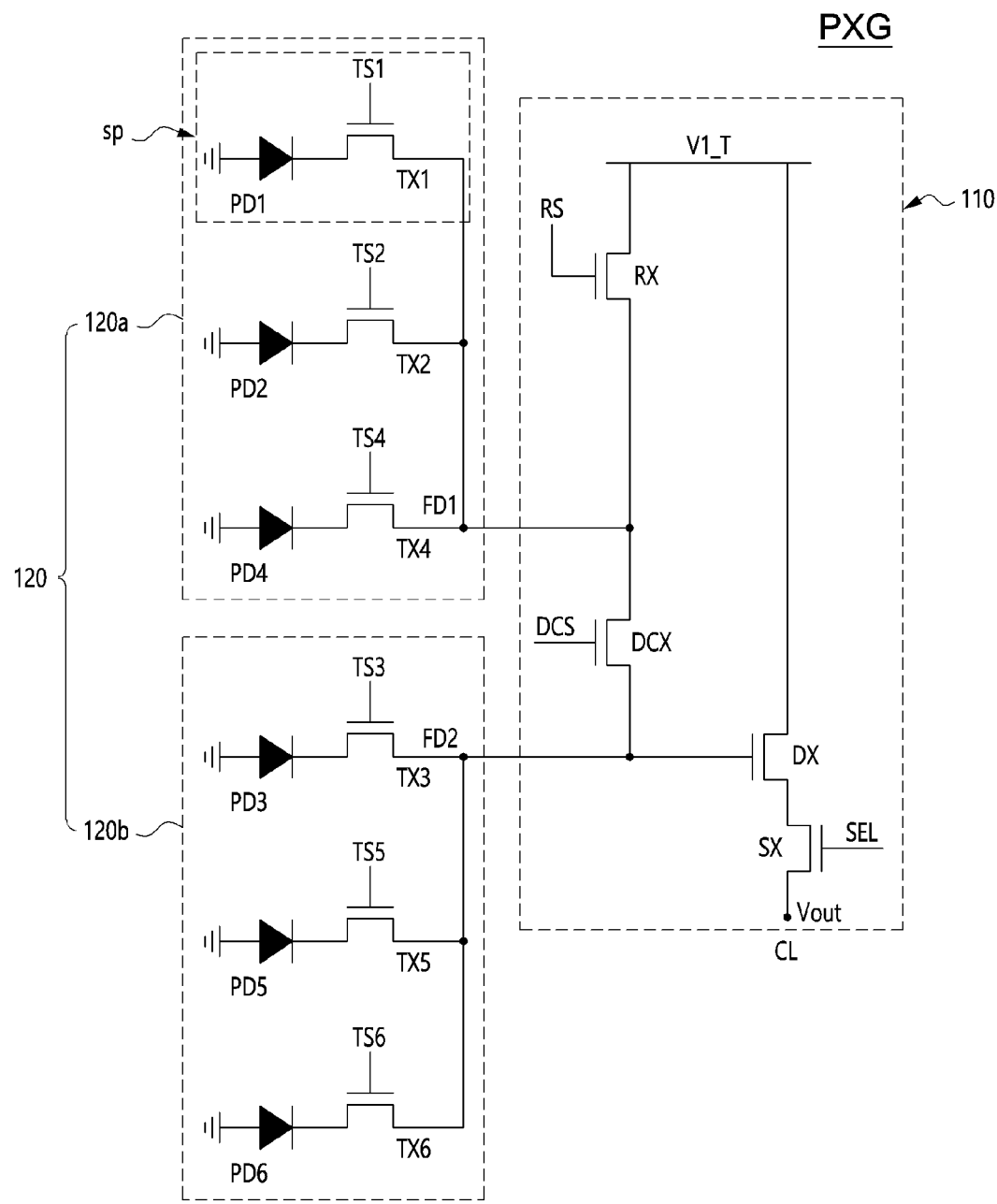

FIGS. 2A and 2B are equivalent circuit diagrams illustrating a pixel group in accordance with example embodiments.

Referring to FIG. 1 and FIG. 2A, the pixel group PXG may include a pixel signal generation circuit 110, a light-receiving circuit 120 and at least one floating diffusion. In example embodiments, one pixel group PXG may include an even number of floating diffusions (floating diffusion regions). Here, the pixel group PXG may include a first floating diffusion FD1 and a second floating diffusion FD2, not limited thereto.

The pixel signal generation circuit 110 may generate a pixel output signal Vout based on an amount of photo-included electrical charge obtained by the light to electrical conversion in the light-receiving circuit 120. The light-receiving circuit 120 may generate electrical charge in an amount in accordance with an exposure time and the intensity of received light.

In example embodiments, the pixel signal generation circuit 110 may include at least one pixel transistor. For example, the pixel transistor may include a reset transistor RX, a dual conversion transistor DCX, a drive transistor DX and a selection transistor SX.

The reset transistor RX, the dual conversion transistor DCX, the drive transistor DX and the selection transistor SX may be operated in response to signals related to rows provided from the row driver 20, for example, a reset signal RS, a dual conversion signal DCS and a selection signal SEL.

The reset transistor RX may be electrically connected between a pixel power terminal V1_T that applies a pixel power voltage and the dual conversion transistor DCX. The reset transistor RX may reset the first floating diffusion FD1 and the second floating diffusion FD2 in response to the reset signal RS. The reset transistor RX may receive the reset signal RS as a gate signal. The rest transistor RX may provide the first and second floating diffusions FD1 and FD2 with the pixel power voltage to reset the first and second floating diffusions FD1 and FD2. The pixel power voltage may include a power voltage VDD or a pumping voltage VPP.

The dual conversion transistor DCX may be connected to the second floating diffusion FD2 electrically connected with the first floating diffusion FD1. The dual conversion transistor DCX may be driven in response to the dual conversion signal DCS provided from the row driver 20. For example, a gate of the dual conversion transistor DCX may receive the dual conversion signal DCS. A drain of the dual conversion transistor DCX may be connected to the second floating diffusion FD2. A source of the dual conversion transistor DCX may be floated. In cases, the dual conversion transistor DCX may be omitted in the pixel group PXG.

Alternatively, referring to FIG. 2B, the dual conversion transistor DCX may be connected between the first floating diffusion FD1 and the second floating diffusion FD2. The dual conversion transistor DCX may receive the dual conversion signal DCS as a gate signal. A drain of the dual conversion transistor DCX may be connected to the first floating diffusion FD1. A source of the dual conversion transistor DCX may be connected to the second floating diffusion FD2. Thus, the first and second floating diffusions FD1 and FD2 may be selectively connected by an activating the dual conversion transistor DCX.

The dual conversion transistor DCX may be turned-on together with the reset transistor RX to discharge remaining charges in the first and second floating diffusions FD1 and FD2. The dual conversion transistor DCX may change a charge amount of the first and second floating diffusions FD1 and FD2 in accordance with photograph environments of the object such as a low or high luminance. Thus, the pixel group PXG may be converted into a high conversion gain (HCG) or a low conversion gain (LCG) by driving the dual conversion transistor DCX.

The drive transistor DX may be driven based on the charge amount of the first and/or second floating diffusion FD1 and FD2. For example, the drive transistor DX may be driven as a source follower for amplifying an effective voltage in accordance with the charge amount accumulated in the first and/or second floating diffusion FD1 and FD2 to generate the pixel output signal Vout.

The selection transistor SX may be connected between the drive transistor DX and the column line CL. The selection signal SEL may be sequentially enabled by a unit of column unit in the pixel array 10. The selection signal SEL may be inputted into a gate of the selection transistor SX. When the selection signal SEL may be enabled, the selection transistor SX may be turned-on to transmit the pixel output signal Vout generated in the drive transistor DX to the selected column line CL.

The pixel transistors RX, DCX, DX and SX in the pixel signal generation circuit 110 may include an NMOS transistor. Connection structures of the pixel transistors may be changed into various other shapes.

The light-receiving circuit 120 may include at least one light receiver. The light receiver may include a plurality of photoelectric conversion units configured to generate a charge from an exposed light. The light receiver may be connected with a floating diffusion. In example embodiments, the light receiver may include an odd number of photoelectric conversion units greater than 1.

In example embodiments, when the pixel group PXG may include the first and second floating diffusions FD1 and FD2, the light-receiving circuit 120 of the pixel group PXG may include a first light receiver 120a and a second light receiver 120b.

The first light receiver 120a may be connected to the first floating diffusion FD1. The first light receiver 120a may include an odd number of sub-pixels with photoelectric conversion units, respectively. For example, the example as illustrated shows that the first light receiver 120a includes three sub-pixels which include, respectively, first, second and fourth photoelectric conversion units PD1, PD2 and PD4. The first light receiver 120a may further include first, second and fourth transfer transistor TX1, TX2 and TX4 connected to the first, second and fourth photoelectric conversion units PD1, PD2 and PD4, respectively. The first, second and fourth transfer transistors TX1, TX2 and TX4 may transfer the charges generated by the first, second and fourth photoelectric conversion units PD1, PD2 and PD4 to the first floating diffusion FD1. Thus, drains of the first, second and fourth transfer transistor TX1, TX2 and TX4 may correspond to the first floating diffusion FD1. Sources of the first, second and fourth transfer transistor TX1, TX2 and TX4 may correspond to the first, second and fourth photoelectric conversion units PD1, PD2 and PD4. First, second and fourth transfer signals TS1, TS2 and TS4 may be provided from the row driver 20. The first, second and fourth transfer signals TS1, TS2 and TS4 may be enabled at the same timing or different timings.

The second light receiver 120b may have a structure substantially the same as the structure of the first light receiver 120a with sub-pixels. For example, the second light receiver 120b may include three subpixels that include third, fifth and sixth photoelectric conversion units PD3, PD5 and PD6 and third, fifth and sixth transfer transistors TX3, TX5 and TX6, respectively. The second light receiver 120b may transfer the charge generated by the third, fifth and sixth photoelectric conversion units PD3, PD5 and PD6 to the second floating diffusion FD2 in response to third, fifth and sixth transfer signals TS3, TS5 and TS6 similarly to the operations of the first light receiver 120a.

As shown in FIG. 2A, the first and second floating diffusions FD1 and FD2 may be electrically connected with each other to transfer the summed charges generated by the first and second floating diffusions FD1 and FD2 to the gate of the drive transistor DX. Alternatively, as shown in FIG. 2B, the charges of the first and second floating diffusions FD1 and FD2 may be selectively summed in response to a turn-on of the drive of the dual conversion signal DCS. The charge amount of the first and second floating diffusions FD1 and FD2 may be controlled by selectively driving the transfer transistors TX1-TX6. For example, the pixel group PXG may be configured to include sub-pixels such as (3×1) sub-pixels by driving the transfer transistors TX1-TX3 in the first light receiver 120a or by driving the transfer transistors TX4-TX6 in the second light receiver 120b. The summed charges of the first and second floating diffusions FD1 and FD2 may be converted into the pixel output signal Vout by the pixel signal generation circuit 110. The column driver 30, the output circuit 40 and the image processor 70 may convert the pixel output signal Vout into the image signal.

The operations of the pixel signal generation circuit 110 and the light-receiving circuit 120 may be disclosed in Korean Patent Application No. 2021-00194335, which are incorporated herein by reference in its entirety.

In example embodiments, the pixel signal generation circuit 110 may be included in one pixel group PXG, not limited thereto. For example, the pixel signal generation circuit 110 may be included in a plurality of the pixel groups PXG. Further, the pixel signal generation circuit 110 may have various configurations and arrangements. Further, the transfer transistors TX1-TX6 may be the light-receiving circuit 120, not limited thereto. For example, the transfer transistors TX1-TX6 may be interpreted as a pixel transistor.

Figure 3A:
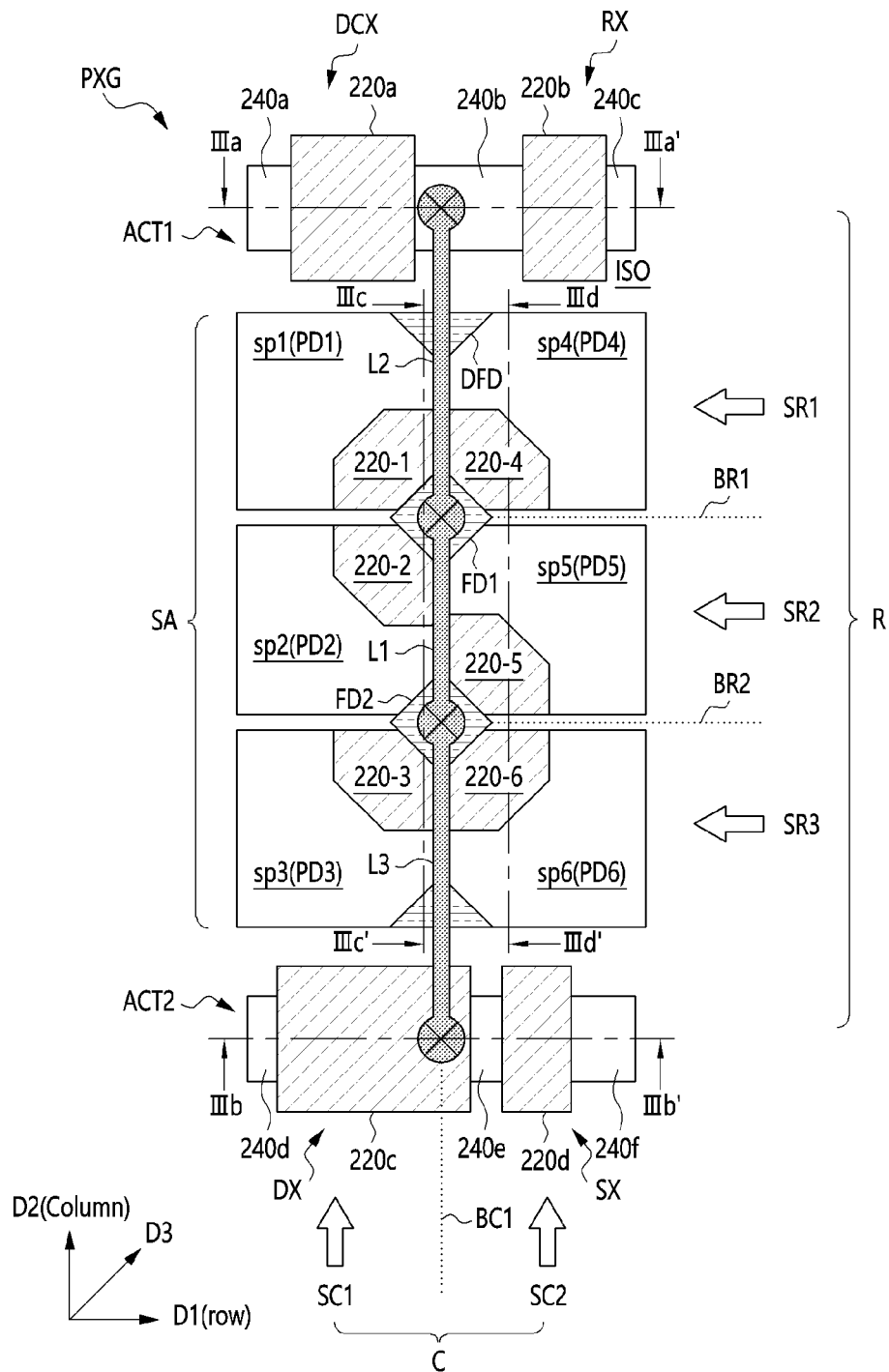
FIGS. 3A and 3B are plan views illustrating a pixel group in accordance with example embodiments.
Figure 3B:
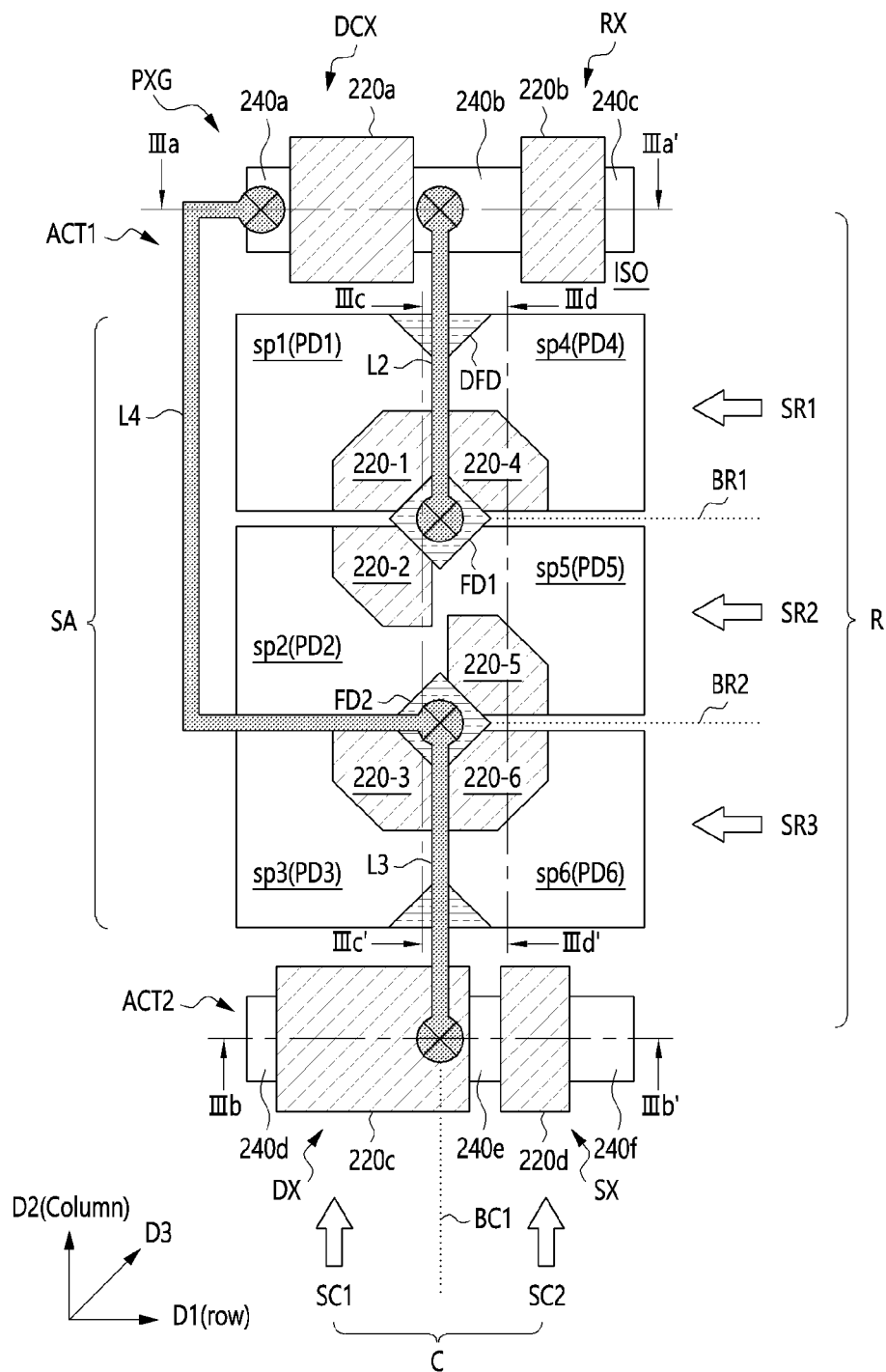
Figure 4A:
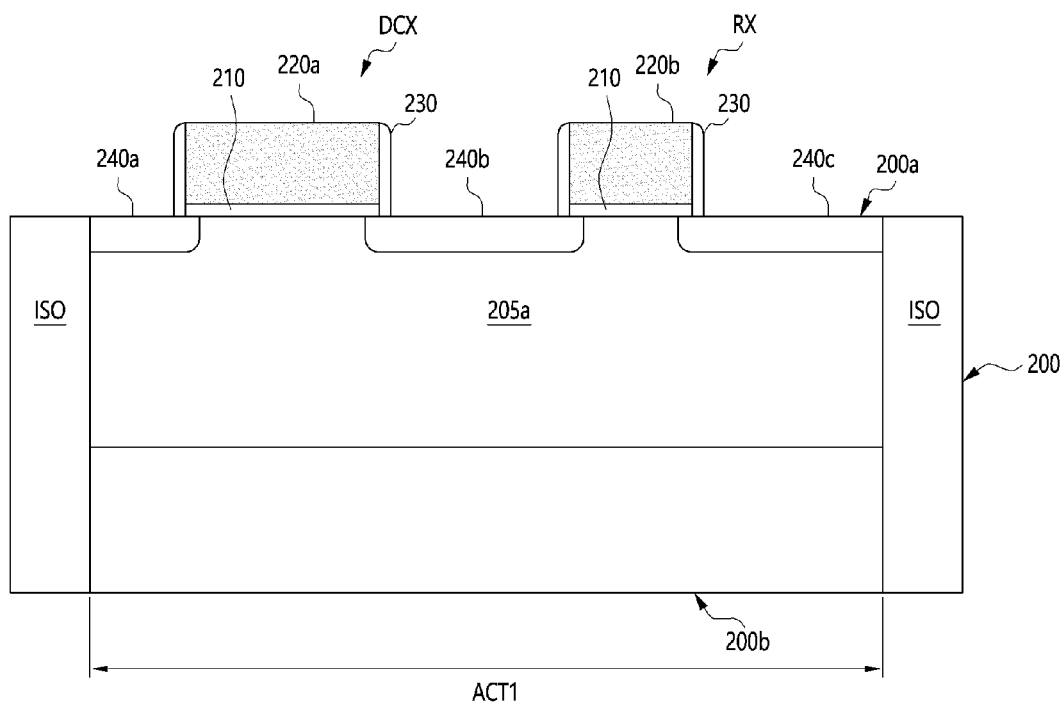
FIG. 4A is a cross-sectional view taken along a line IIIa-IIIa' in FIG. 3A.
Figure 4B:
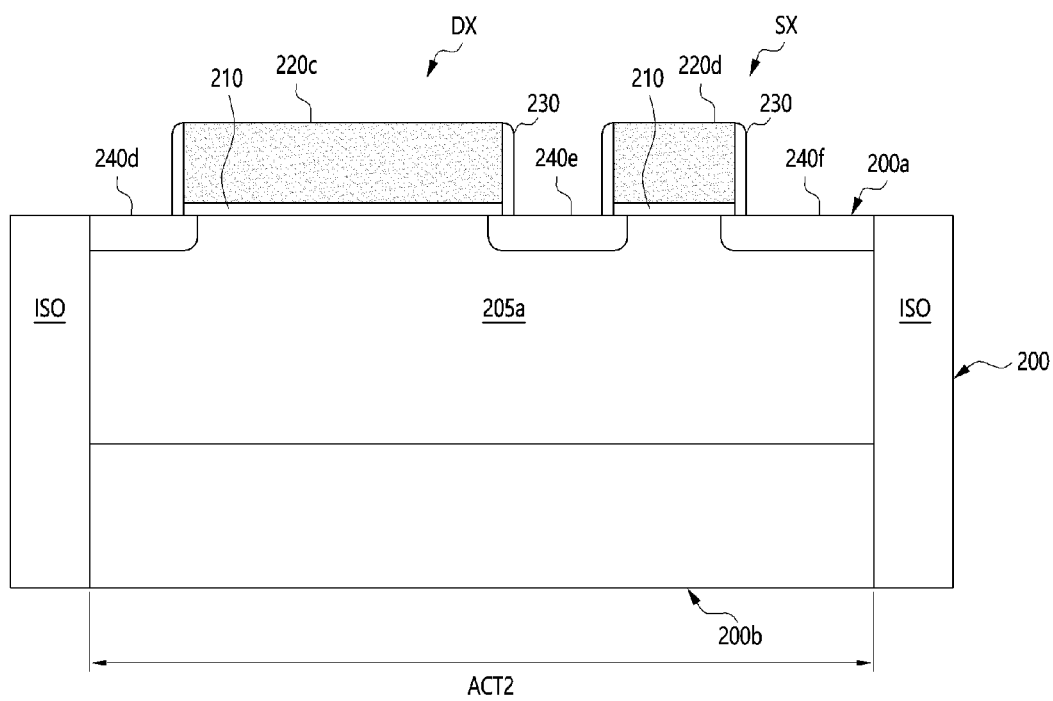
FIG. 4B is a cross-sectional view taken along a line IIIb-IIIb' in FIG. 3A.
Figure 4C:
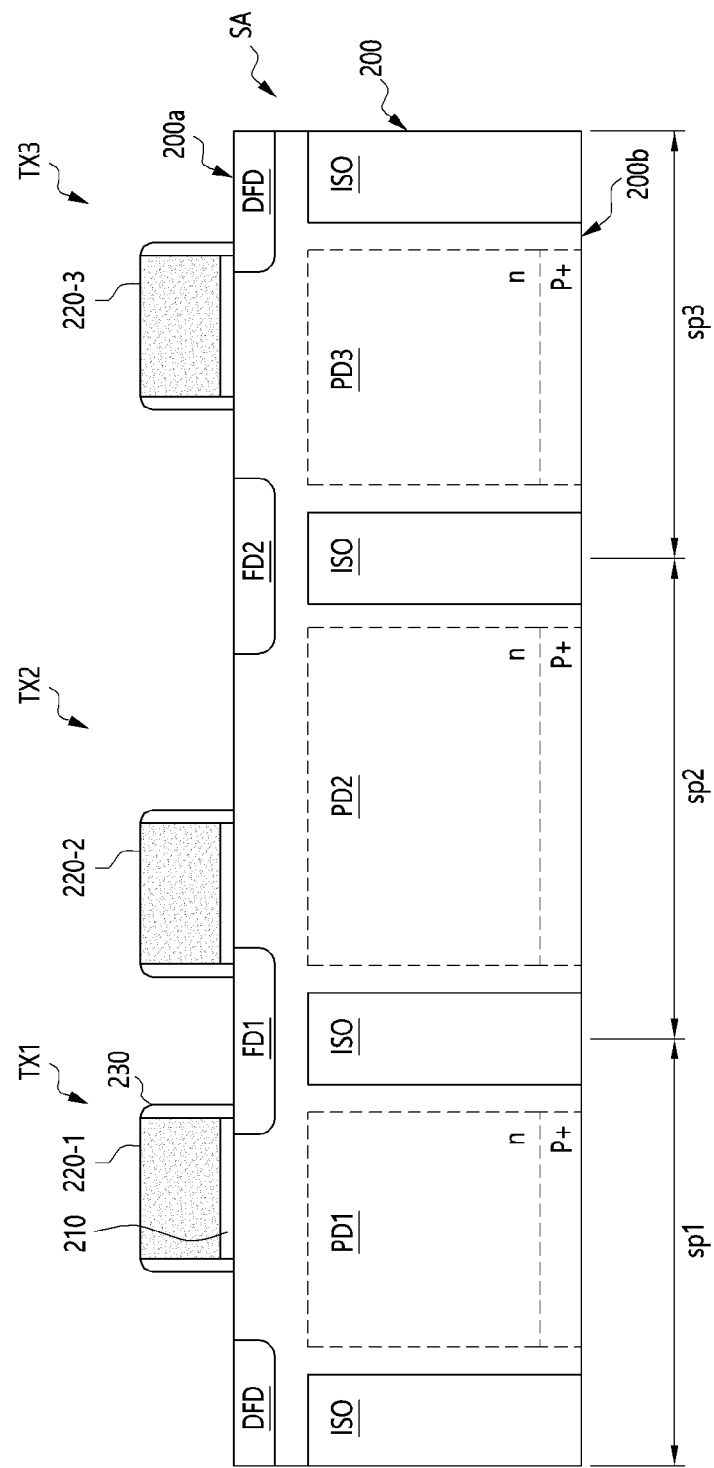
FIG. 4C is a cross-sectional view taken along a line IIIc-IIIc' in FIG. 3A.
Figure 4D:
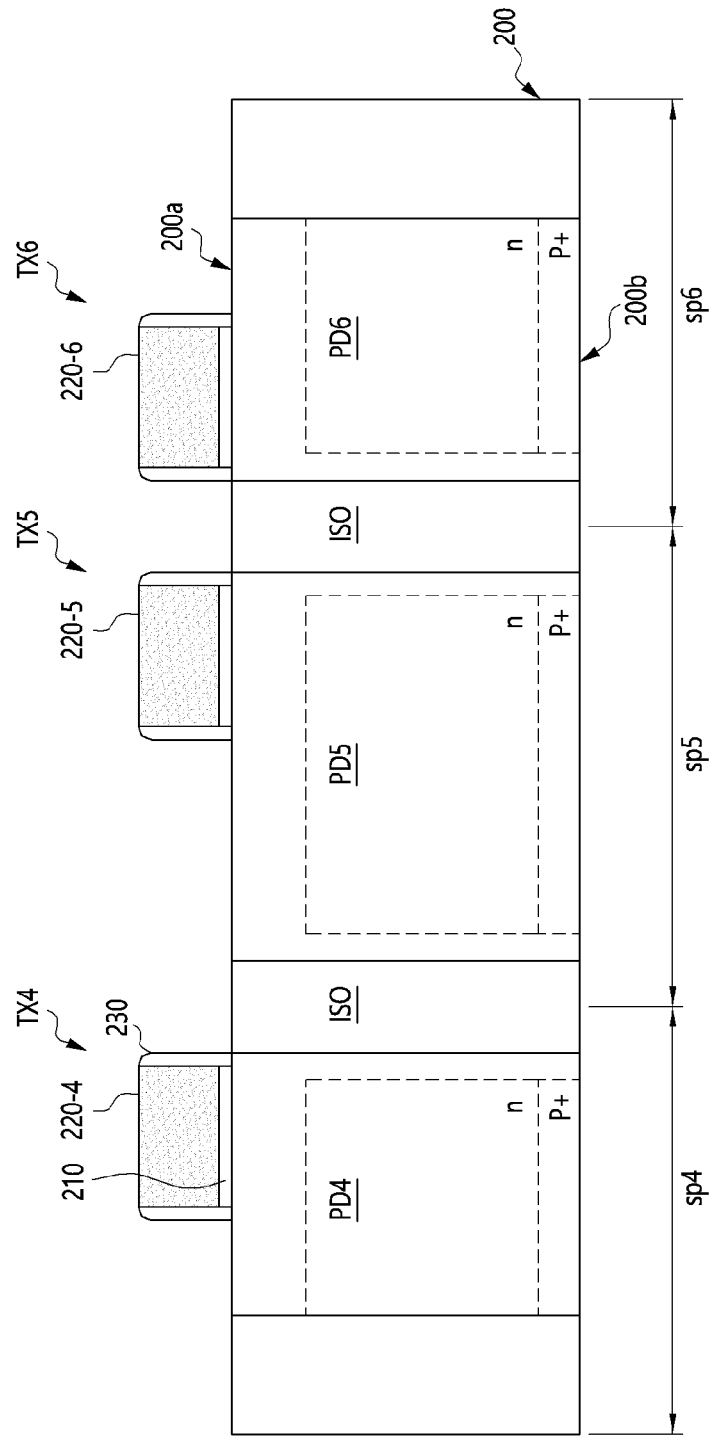
FIG. 4D is a cross-sectional view taken along a line IIId-IIId' in FIG. 3A.

FIGS. 3A and 3B are plan views illustrating a pixel group in accordance with example embodiments, FIG. 4A is a cross-sectional view taken along a line IIIc-IIIc' in FIG. 3A, FIG. 4B is a cross-sectional view taken along a line IIIb-IIIb' in FIG. 3A, FIG. 4C is a cross-sectional view taken along a line IIIc-IIIc' in FIG. 3A and FIG. 4D is a cross-sectional view taken along a line IIId-IIId' in FIG. 3A. For reference, a pixel group PXG including (3×2) sub-pixels may be exemplarily explained in example embodiments. A pixel group in FIG. 3A is a plan view based on the equivalent circuit diagram in FIG. 2A. A pixel group in FIG. 3B is a plan view based on an equivalent circuit diagram in FIG. 2B.

Referring to FIGS. 3A and 4A to 4D, the pixel group PXG may include a first active region ACT1, a second active region ACT2 and a light-receiving region SA. The light-receiving region SA may include a plurality of sub-pixels sp1-sp6.

The first active region ACT1, the second active region ACT2 and the light-receiving region SA may be formed in a substrate 200. The first active region ACT1, the second active region ACT2 and the light-receiving region SA may be defined by an isolation structure ISO in the substrate 200.

The substrate 200 may have a first surface 200a and a second surface 200b opposite to the first surface 200a. For example, the transistors DCX, RX, DX and SX in the pixel signal generation circuit 110 and the transfer transistors TX1-TX6 in FIG. 2A and FIG. 2B may be formed in the first surface 200a of the substrate 200, i.e., a front surface of the substrate 200.

A plurality of color filters (not shown) and a plurality of micro-lens may be arranged on the second surface 200b of the substrate 200, i.e., a rear surface of the substrate 200. For example, a light transferred from an object may be incident through the second surface 200b of the substrate 200.

In example embodiments, the substrate 200 may include a semiconductor substrate including an element in group IV on the periodic table. For example, the substrate 200 may include a single crystalline silicon substrate. A thinning process may be performed on the substrate 200 to reduce a thickness of the substrate 200. Further, the substrate 200 may include a single crystalline silicon layer having an epitaxial layer. Alternatively, the substrate 200 may include conductive impurities or a conductive well.

The isolation structure ISO may be configured to be contacted with at least one of the first surface 200a and the second surface 200b of the substrate 200. The isolation structure ISO may include a trench formed through the substrate 200 and a deep trench isolation (DTI) structure formed in the trench. The DTI may include an insulation material. For example, the DTI type isolation structure ISO may be formed by a back deep trench isolation (BDTI) process or a front deep trench isolation (FDTI) process. Further, the isolation structure ISO may have a structure including the DTI structure and a junction isolation structure.

The isolation structure ISO having a same shape may be configured to electrically isolate between the first active region ACT1 and the light-receiving region SA, between the second active region ACT2 and the light-receiving region SA and between the sub-pixels of the light-receiving region SA from each other. Alternatively, the isolation structure ISO having different shapes may be configured to electrically isolate between the first active region ACT1 and the light-receiving region SA, between the second active region ACT2 and the light-receiving region SA and between the sub-pixels of the light-receiving region SA from each other.

In example embodiments, the first active region ACT1 and the second active region ACT2 between the light-receiving region SA may be positioned may extend in parallel in the first direction D1, for example, a row direction.

As shown in FIGS. 3A and 4A, the dual conversion transistor DCX and the reset transistor RX may be formed in the first active region ACT1.

In order to integrate the dual conversion transistor DCX as the NMOS transistor and the reset transistor RX in the first active region ACT1, a first conductive type well 205a, for example, a p-well may be formed in the substrate 200 in the first active region ACT1. The first active region ACT1 may correspond to an optical black region configured to distinguish the color filter.

A dual conversion gate 220a and a reset gate 220b may be formed in the first active region ACT1. The dual conversion gate 220a and the reset gate 220b may be spaced apart from each other. A gate insulation layer 210 may be interposed between the dual conversion gate 220a and a surface of the first active region ACT1, i.e., the first surface 200a and between the reset gate 220b and the surface of the first active region ACT1. Junction regions 240a, 240b and 240c may be formed in the first active region ACT1 at both sides of the dual conversion gate 220a and the reset gate 220b to form the dual conversion transistor DCX and the reset transistor RX. The junction regions 240a, 240b and 240c may include second type impurities opposite to the first conductive type, for example, an N type. The junction region 240a may correspond to a source of the dual conversion transistor DCX. The junction region 240b may correspond to a drain of the dual conversion transistor DCX and a source of the reset transistor RX. The junction region 240c may correspond to a drain of the reset transistor RX. The source 240a of the dual conversion transistor DCX may be electrically floated based on FIG. 2A. A gate of the dual conversion transistor DCX (hereinafter, referred to as the dual conversion gate 220a) may have a width wider than a width of a gate of the reset transistor RX (hereinafter, referred to as the reset gate 220b), not limited thereto. A reference numeral 230 may be a gate sidewall spacer. For example, the first active region ACT1 may have a pattern shape corresponding to each of the pixel groups PXG, not limited thereto.

Referring to FIGS. 3A and 4B, the drive transistor DX and the selection transistor SX may be formed in the second active region ACT2. As shown in FIG. 2A and FIG. 2B, because the drive transistor DX and the selection transistor SX may include the NMOS transistor, the second active region ACT2 may include a first conductive type well 205a that is, p-well. The second active region ACT2 may be formed at a position corresponding to the optical black region (not shown) similarly to the first active region ACT1.

A gate of the drive transistor DX (hereinafter, referred to as a drive gate 220c) and a gate of the selection transistor SX (hereinafter, referred to as a selection gate 220d) between which the gate insulation layer 210 may be formed may be positioned over the second active region ACT2. As mentioned above, because the drive transistor DX may be driven as the source follower configured to amplify the charges generated in the floating diffusions FD1 and FD2, the drive transistor DX may have a high drive force relatively compared to other pixel transistors RX, DCX, SX and TX1-TX6. Thus, the drive gate 220c may have a width wider than widths of the selection gate 220d, the dual conversion gate 220a and the reset gate 220b.

Junction regions 240d, 240e and 240f may be formed in the second active region ACT2 at both sides of the drive gate 220c and the selection gate 220d to form the drive transistor DX and the selection transistor SX. The junction regions 240d, 240e and 240f may include second type impurities opposite to the first conductive type, for example, an N type. The junction region 240d may correspond to a drain of the drive transistor DX. The junction region 240e may correspond to a source of the drive transistor DX and a drain of the selection transistor SX. The junction region 240f may correspond to a source of the selection transistor SX. Further, the second active region ACT2 may have a pattern shape separated from the pixel groups PXG, not limited thereto.

Referring to FIGS. 3A, 4C and 4D, the light-receiving circuit 120 in FIG. 2A and FIG. 2B and the first and second floating diffusions FD1 and FD2 may be integrated in the light-receiving region SA.

In example embodiments, the light-receiving region SA may include first to sixth sub-pixels sp1-sp6 arranged in a (3×2) matrix.

For example, one row R may include first to third sub-rows SR1-SR3. The first sub-pixel sp1 and the fourth sub-pixel sp4 may be arranged in parallel in the first sub-row SR1. The second sub-pixel sp2 and the fifth sub-pixel sp5 may be arranged in parallel in the second sub-row SR2. The third sub-pixel sp3 and the sixth sub-pixel sp6 may be arranged in parallel in the third sub-row SR3.

One column C substantially perpendicular to the row R may include first and second sub-columns SC1 and SC2 in parallel arranged. The first to third sub-pixels sp1-sp3 may be arranged in parallel in the first sub-column SC1. The fourth to sixth sub-pixels sp4-sp6 may be arranged in parallel in the second sub-column SC2.

The first to sixth sub-pixels sp1-sp6 may be electrically isolated from each other by the isolation structure ISO. The photoelectric conversion units PD1-PD6 and the gates of the transfer transistors (hereinafter, referred to as transfer gates: 220-1-220-6) may be formed in a space defined by the sub-pixels sp1-sp6. Hereinafter, the sub-pixel sp may be a region where one photoelectric conversion unit and one transfer gate may be integrated.

In example embodiments, the first light receiver 120a in FIG. 2A and FIG. 2B may include the first, second and fourth sub-pixels sp1, sp2 and sp4. The second light receiver 120b may include the third, fifth and sixth sub-pixels sp3, sp5 and sp6.

As mentioned above, each of the photoelectric conversion units PD1-PD6 may generate the charge corresponding to the exposed amount of the light incident through the second surface 200b of the substrate 200. The photoelectric conversion units PD1-PD6 may include a photo diode, a photo transistor, a photo gate, a pinned photo diode, a combination thereof, etc.

In example embodiments, the photoelectric conversion units PD1-PD6 may be formed in the substrate 200 divided into the sub-pixels sp1-sp6. For example, the photoelectric conversion units PD1-PD6 may include a second conductive type impurity region n and a first heavily doped impurity region $p^+$. For example, the first heavily doped impurity region $p^+$ may be formed in the second surface 200b of the substrate 200. The first heavily doped impurity region $p^+$ may be in contact with the second conductive type impurity region n.

The first floating diffusion FD1 may be formed at contact points between the first, second, fourth and fifth sub-pixels sp1, sp2, sp4 and sp5. The second floating diffusion FD2 may be formed at contact points between the second, third, fifth and sixth sub-pixels sp2, sp3, sp5 and sp6. The first and second floating diffusions FD1 and FD2 may include a second conductive type impurity region, for example, an n type impurity region.

The first floating diffusion FD1 may be surrounded by first, second and fourth transfer gates 220-1, 220-2 and 220-4. For example, the first transfer gate 220-1 and the second transfer gate 220-2 may be arranged symmetrically with each other with respect to a boundary BR1 between the first sub-row SR1 and the second sub-row SR2. That is, the second transfer gate 220-2 may have a shape formed by rotating the first transfer gate 220-1 by about 90° in a counter clockwise direction. The first transfer gate 220-1 and the fourth transfer gate 220-4 may be arranged folded-symmetrically with each other with respect to a boundary BC1 between the first sub-column SC1 and the second sub-column SC2. That is, the fourth transfer gate 220-4 may have a shape formed by rotating the first transfer gate 220-1 by about 90° in a clockwise direction.

The second floating diffusion FD2 may be surrounded by third, fifth and sixth transfer gates 220-3, 220-5 and 220-6. For example, the third transfer gate 220-3 and the sixth transfer gate 220-6 may be arranged folded-symmetrically with each other with respect to the boundary BC1 between the first sub-column SC1 and the second sub-column SC2. The sixth transfer gate 220-6 may have a shape formed by rotating the third transfer gate 220-3 by about 90° in the counter clockwise direction. The fifth transfer gate 220-5 and the sixth transfer gate 220-6 may be arranged folded-symmetrically with each other with respect to a boundary BR2 between the second sub-row SR2 and the third sub-row SR3. The sixth transfer gate 220-6 may have a shape formed by rotating the fifth transfer gate 220-5 by about 90° in the clockwise direction.

The transfer gates 220-1 and 220-4 located on the first sub-row SR1 and the transfer gates 220-3 and 220-6 located on the third sub-row SR3 may be symmetrical with each other with respect to the second direction D2. The second transfer gate 220-2 and the fifth transfer gate 220-5 located on the second sub-row SR2 may be symmetrical with each other with respect to the diagonal direction D3. For example, the second transfer gate 220-2 and the fifth transfer gate 220-5 may be twice symmetrical with each other with respect to the first and second directions D1 and D2.

Therefore, the second transfer gate 220-2 and the third transfer gate 220-3 on the first sub-column SC1 may have substantially the same shape. The fourth transfer gate 220-4 and the fifth transfer gate 220-5 on the second sub-column SC2 may have substantially the same shape.

As above, the sub-pixels sp1-sp6 may include the transfer gates 220-1-220-6 and the photoelectric conversion units PD1-PD6, respectively. The photoelectric conversion units PD1-PD6 may be the sources of the transfer transistors TX1-TX6. The photoelectric conversion units PD1-PD6 may be formed In the light-receiving region SA on one side of each of the transfer gates 220-1-220-6. The floating diffusion FD1 or FD2 may be a drain of each of the transfer transistors TX1-TX6.

In example embodiments, although an odd number of photoelectric conversion units PD may be connected in common with one floating diffusion FD1 or FD2 through the transfer transistors TX1-TX6, an even number of floating diffusions FD1 and FD2 may be provided to the light-receiving region SA of the pixel group PXG so that the photoelectric conversion units PD1-PD6 may be arranged symmetrically with each other in all directions.

As mentioned above, the sub-pixels sp1-sp6 with the photoelectric conversion units PD1-PD6 may be electrically isolated from each other by the isolation structure ISO. As shown in FIG. 4C, the isolation structure ISO at a region where the first and second floating diffusions FD1 and FD2 may be formed may be extended from a portion, which may be spaced apart from bottom surfaces of the first and second floating diffusions FD1 and FD2, to the second surface 200b of the substrate 200.

A reference numeral DFD may be a dummy floating diffusion. In order to provide uniform areas of the photoelectric conversion units PD1-PD6, the dummy floating diffusion DFD may be arranged between the sub-pixels sp1, sp3, sp4 and sp6 on the first and third sub-rows SR1 and SR3. The dummy floating diffusion DFD may be formed by a process substantially the same as the process for forming the first and second floating diffusions FD1 and FD2. However, the dummy floating diffusion DFD may be electrically floated without connecting the first floating diffusion FD1 and the second floating diffusion FD2.

Further, the first floating diffusion FD1 and the second floating diffusion FD2 may be in parallel arranged in the second direction D2. For example, when the equivalent circuit diagram in FIG. 2A may be based, the first floating diffusion FD1 may be electrically connected with the second floating diffusion FD2 through a first conductive line L1. The first conductive line L1 may be positioned on a boundary between the second sub-pixel sp2 and the fifth sub-pixel sp5.

The first floating diffusion FD1 may be electrically connected with the drain 240b of the dual conversion transistor DCX through a second conductive line L2. The second conductive line L2 may be positioned on a boundary between the first sub-pixel sp1 and the fourth sub-pixel sp4.

The second floating diffusion FD2 may be electrically connected with the drive gate 220c through a third conductive line L3. The third conductive line L3 may be positioned on a boundary between the third sub-pixel sp3 and the sixth sub-pixel sp6.

Although the first to third conductive lines L1-L3 may include a non-transparent material, the light-receiving region, i.e., a fill-factor of the photoelectric conversion units PD1-PD6 may not be affected, because the first to third conductive lines L1-L3 may be positioned over the isolation structure ISO configured to isolate the sub-pixels from each other.

The first to third conductive lines L1-L3 may be positioned on a same plane. Alternatively, any one of the first to third conductive lines L1-L3 may be positioned on a level different from a level on which remaining conductive lines may be positioned. In example embodiments, the level of the first to third conductive lines L1-L3 may be a distance between the first to third conductive lines L1-L3 and the first surface 200a of the substrate 200.

When the pixel group PXG may be formed based on the equivalent circuit diagram in FIG. 2B, as shown in FIG. 3B, the first floating diffusion FD1 may be electrically isolated from the second floating diffusion FD2. That is, the first conductive line L1 in FIG. 3A may be omitted. In contrast, the source 240a of the dual conversion transistor DCX may be connected with the second floating diffusion FD2 through a fourth conductive line L4. The first floating diffusion FD1 may be selectively connected with the second floating diffusion FD2 by driving the dual conversion transistor DCX. The fourth conductive line L4 may be arranged over the isolation structure ISO or at a region corresponding to the optical black region (not shown) to reduce the influence of the fill-factor of the pixel group PXG.

Figure 5:
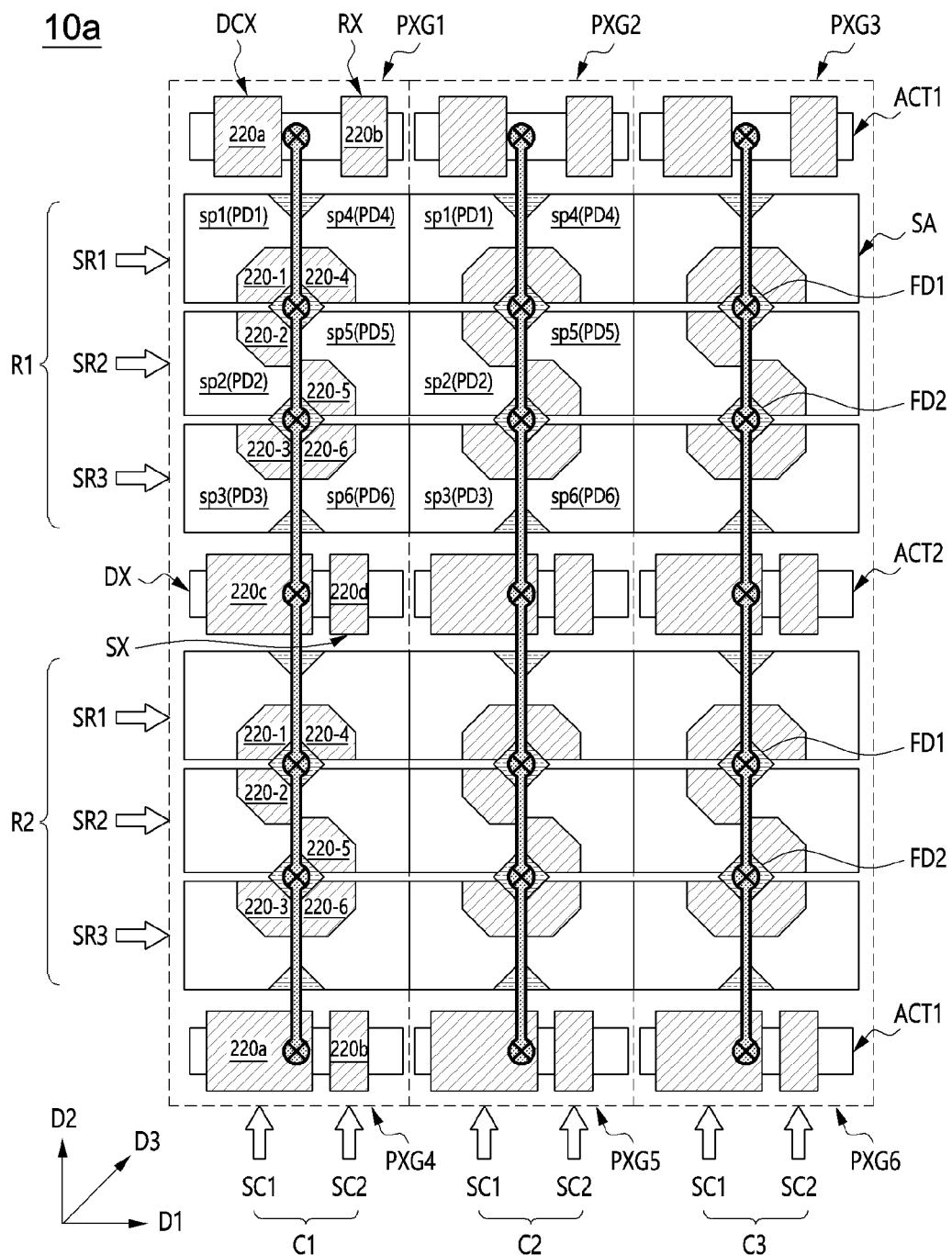
FIG. 5 is a plan view illustrating a pixel array in accordance with example embodiments.
Figure 6:
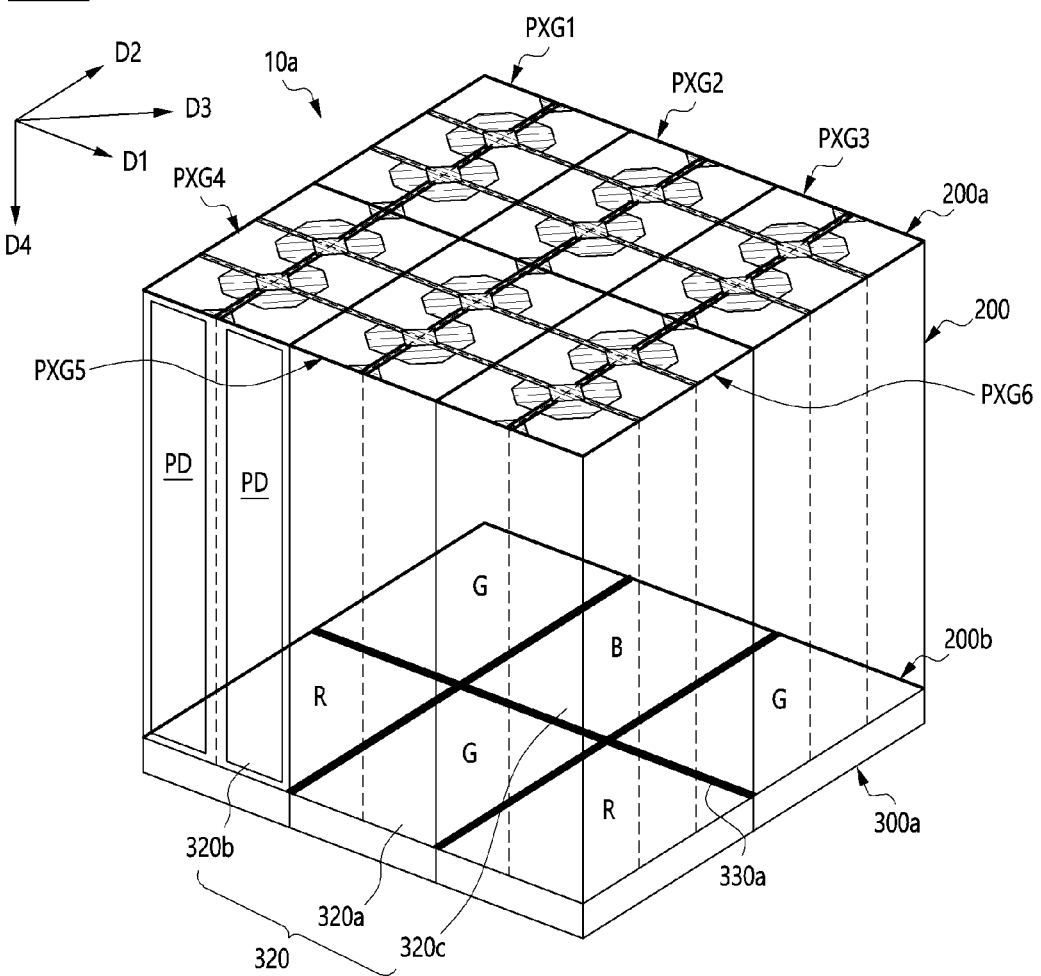
FIG. 6 is a perspective view illustrating an image sensing device with the pixel array in FIG. 5.

FIG. 5 is a plan view illustrating a pixel array in accordance with example embodiments and FIG. 6 is a perspective view illustrating an image sensing device with the pixel array in FIG. 5.

Referring to FIGS. 5 and 6, an image sensing device 100a may include a pixel array 10a and a color filter layer 300a.

The pixel array 10a may include a plurality of pixel groups PXG1-PXG6 arranged between a plurality of rows R1 and R2 and a plurality of columns C1, C2 and C3 in a matrix type. The plurality of pixel groups PXG1-PXG6 may be integrated on a first surface 200a of a substrate 200. Each of the pixel groups PXG1-PXG6 may include the sub-pixels sp1-SP6 arranged in the matrix type in FIG. 3A or FIG. 3B.

In example embodiments, the first to third pixel groups PXG1-PXG3 may be in parallel arranged along a first row R1. All of the first to third pixel groups PXG1-PXG3 on the first row R1 may be selected by signals for selecting the first row R1 provided from the row driver 20 in FIG. 1. The fourth to sixth pixel groups PXG4-PXG6 may be in parallel arranged along a second row R2 substantially parallel to the first row R1. All of the fourth to sixth pixel groups PXG4-PXG6 on the second row R2 may be selected by signals for selecting the second row R2 provided from the row driver 20.

The first and fourth pixel groups PXG1 and PXG4 may be in parallel arranged on the first column C1. A pixel output signal of the first or fourth pixel groups PXG1 or PXG4 may be read-out by signals for selecting the first column C1 provided from the column driver 30 in FIG. 1.

The second and fifth pixel groups PXG2 and PXG5 may be in parallel arranged on the second column C2. A pixel output signal of the second or fifth pixel groups PXG2 or PXG5 may be read-out by signals for selecting the second column C2 provided from the column driver 30.

The third and sixth pixel groups PXG3 and PXG6 may be in parallel arranged on the third column C3. A pixel output signal of the third or sixth pixel groups PXG3 or PXG6 may be read-out by signals for selecting the third column C3 provided from the column driver 30.

For example, the active regions ACT1 and ACT2 where the pixel signal generation circuit 110 in FIG. 2A or FIG. 2B may be formed may be extended outside the light-receiving region SA of the pixel group PXG in the first direction D1. The first active region ACT1 in which the reset transistor RX and the dual conversion transistor DCX for controlling the first to third pixel groups PXG1-PXG3 may be formed may be arranged outside the first row R1 opposite to the first to third pixel groups PXG1-PXG3. The first active region ACT1 in which the reset transistor RX and the dual conversion transistor DCX for controlling the fourth to sixth pixel groups PXG4-PXG6 may be formed may be arranged outside the second row R2 opposite to the fourth to sixth pixel groups PXG4-PXG6.

The second active region ACT2 in which the drive transistor DX and the selection transistor SX may be formed may be arranged corresponding to the pixels between the first row R1 and the second row R2.

In example embodiments, the first pixel group PXG1 and the fourth pixel group PXG4 may share the drive transistor DX and the selection transistor SX integrated in the second active region ACT2. In FIG. 5, the pixel groups arranged adjacent along the second direction D2 may commonly share the drive transistor DX and the selection transistor SX, not limited thereto. For example, the dual conversion transistor DCX and the reset transistor RX may be commonly shared with the adjacent pixel groups by various design alternations. The arrangement of the pixel signal generation circuit 110 may be variously changed within no influence of the light-receiving region. The pixel output signal of the pixel group selected by various control signals, which may be provided from the row driver and the column driver 30, for example a selection signal SEL may be generated.

The color filter layer 300a may be arranged on a second surface 200b of the substrate 200. The color filter layer 300a may include a plurality of color filters 320 and an optical black region 330a. Each of the plurality of color filters 320 may be divided by the optical black region 330a. The plurality of color filters 320 may include primary color filters. The plurality of color filters 320 may include first to third color filters 320a-320c having different colors. For example, the first to third color filters 320a-320c may include a green color filter (G), a red color filter (R) and a blue color filter (B), respectively. The first to third color filters 320a-320c may be arranged in a Bayer pattern manner, not limited thereto. Alternatively, the first to third color filters 320a-320c may include a cyan color filter, a magenta color filter, a yellow color filter, etc.

Each of the plurality of pixel groups PXG1-PXG6 may correspond to each of the color filters 320a-320c. A size of each of the color filters 320a-320c may correspond to a size of the light-receiving region SA of each of the pixel groups PXG1-PXG6. For example, when the first pixel group PXG1 may correspond to the first color filter 320a, the pixel output signal Vout of the first pixel group PXG1 may output first color information about incident light on an object (not shown). For example, the pixel output signal Vout corresponding to one among the color filters 320a, 320b or 320c may be generated based on the charge collected from the photoelectric conversion units PD1-PD6. In FIG. 6, a direction D4 may be a depth direction of the substrate 200.

Figure 7:
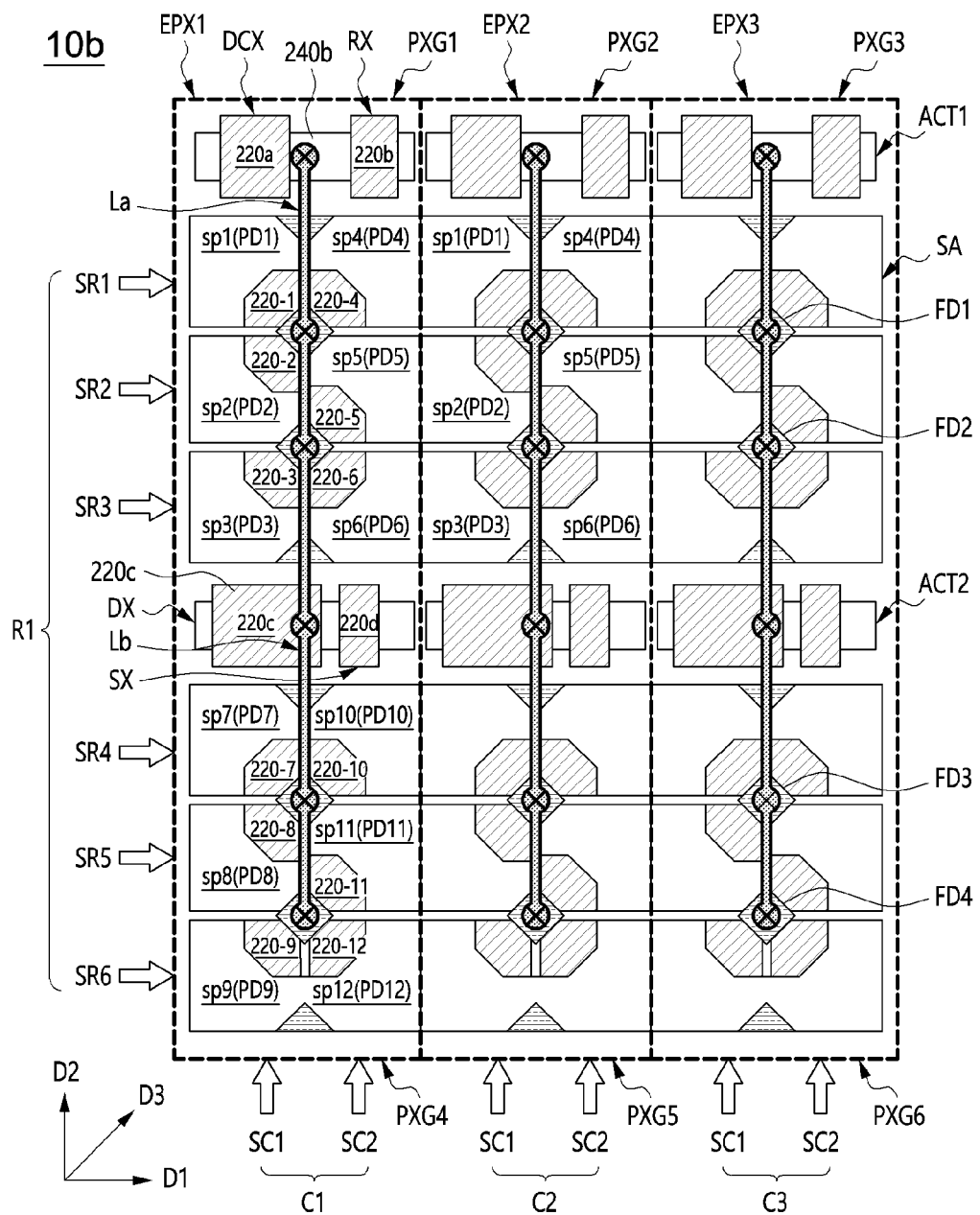
FIG. 7 is a plan view illustrating an expanded pixel array in accordance with example embodiments.
Figure 8:
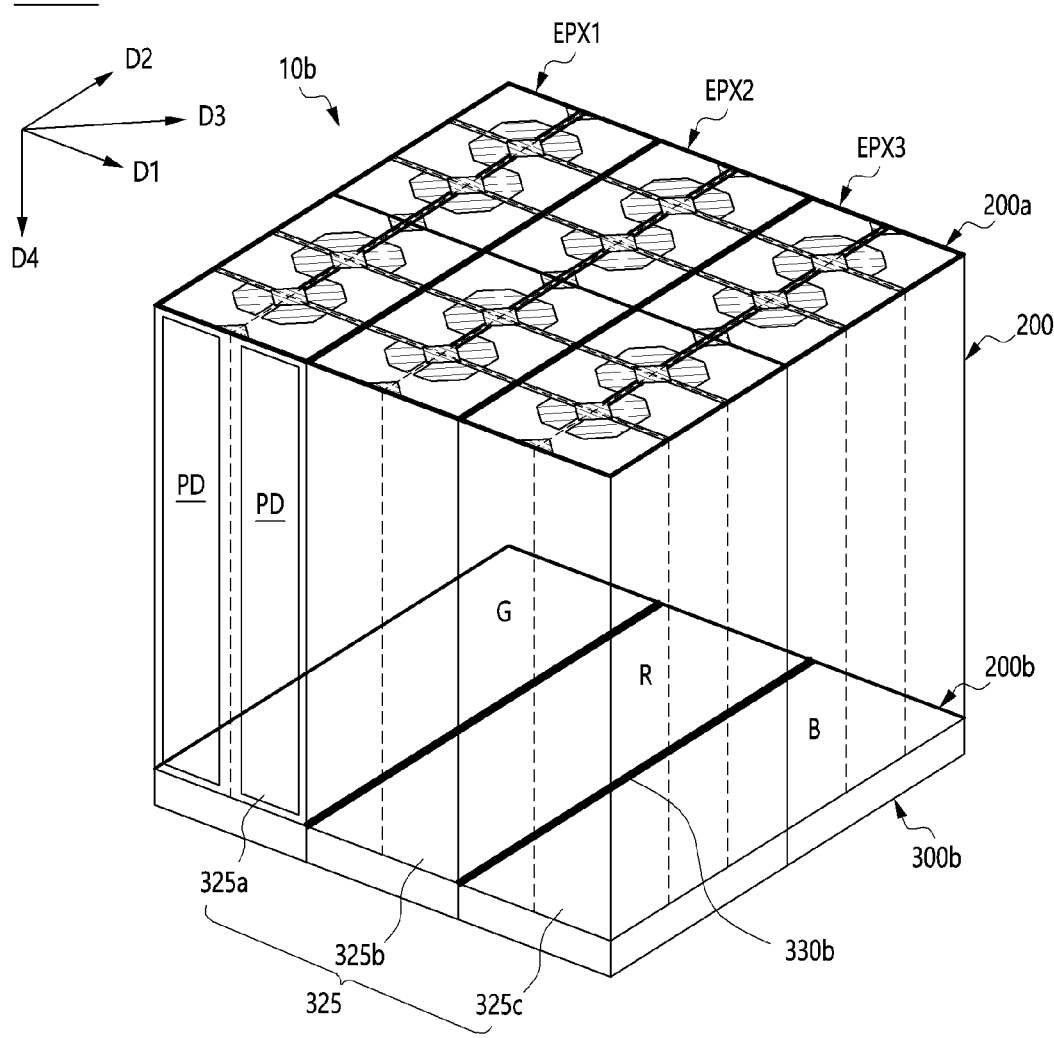
FIG. 8 is a perspective view illustrating an image sensing device with the expanded pixel array in FIG. 7.

FIG. 7 is a plan view illustrating an expanded pixel array in accordance with example embodiments and FIG. 8 is a perspective view illustrating an image sensing device with the expanded pixel array in FIG. 7.

Referring to FIGS. 7 and 8, an image sensing device 100b may include a pixel array 10b and a color filter layer 300b.

The pixel array 10b may include a plurality of expanded pixel groups EPX1-EPX3 arranged in a matrix type. Each of the expanded pixel groups EPX1-EPX3 may include the sub-pixels sp1-sp12 arranged in a (6×2) matrix type. Hereinafter, a structure of a first expanded pixel group EPX1 may be exemplarily explained.

In example embodiments, the first expanded pixel group EPX1 may include the first and fourth pixel groups PXG1 and PXG4 in parallel arranged along the second direction D2. The first pixel group PXG1 may have a configuration substantially the same as the structure of the first pixel group PXG1 in FIG. 5. The fourth pixel group PXG4 may have a configuration substantially the same as the structure of the fourth pixel group PXG 4 in FIG. 5.

The first active region ACT1 in which the reset transistor RX and the dual conversion transistor DCX of the pixel signal generation circuit 110 in FIG. 2A or FIG. 2B may be formed may be arranged at an upper edge portion of the first pixel group PXG1 similarly to FIG. 5. The second active region ACT2 in which the drive transistor DX and the selection transistor SX of the pixel signal generation circuit 110 may be formed may be arranged between the first pixel group PXG1 and the fourth pixel group PXG4.

The first expanded pixel group EPX1 may include a first floating diffusion FD1 and a second floating diffusion FD2 of the first pixel group PXG1 (or the second pixel group PXG2 or the third pixel group PXG3) and a third floating diffusion FD3 and a fourth floating diffusion FD4 of the fourth pixel group PXG4 (or the fifth pixel group PXG5 or the sixth pixel group PXG6) electrically connected with each other.

Particularly, the first pixel group PXG1 in the first expanded pixel group EPX1 may include conductive lines La connected between the drain 240b of the dual conversion transistor DCX and the first floating diffusion FD1, between the first floating diffusion FD1 and the second floating diffusion FD2, and between the second floating diffusion FD2 and the drive gate 220c.

The fourth pixel group PXG4 in the first expanded pixel group EPX1 may include conductive lines Lb connected between the drive gate 220c and the third floating diffusion FD3 and between the third floating diffusion FD3 and the fourth floating diffusion FD4.

Charges collected in the (6×2) sub-pixels may be transferred to the drive gate 220c through the conductive lines La and Lb, the drive transistor DX may output the pixel output signal when the selection signal SEL is enabled. As mentioned above, the charge amounts of the first to fourth floating diffusions FD1-FD4 may be controlled by activations of the transfer transistors TX1-TX12 in each of the sub-pixels sp1-sp12.

Alternatively, when transfer gates 220-1-220-3 and 220-7-220-9 which are positioned at the first sub-column SC1 receive an enabled signal and transfer gates 220-4-220-6 and 220-10-220-12 which are positioned at the second sub-column SC2 receive a disabling signal, an expanded pixel group EPX may be configured with (6×1) sub-pixels (sp1-sp3 and sp7-sp9).

The color filter layer 300b may be arranged on the second surface 200b of the substrate 200 similarly to FIG. 6. The color filter layer 300b may include a plurality of color filters 325 and an optical black region 330b. Each of the color filters 325 may include first to third color filters 325a, 325b and 325c similarly to FIG. 6. A size of each of the color filters 325a-325c may correspond to a size of each of the expanded pixel groups EPX1-EPX3.

Thus, the pixel output signal outputted from the charges, which is collected by the (6×1) or (6×2) sub-pixels, may represent information of the corresponding color filter 325a, 325b or 325c.

Figure 9:
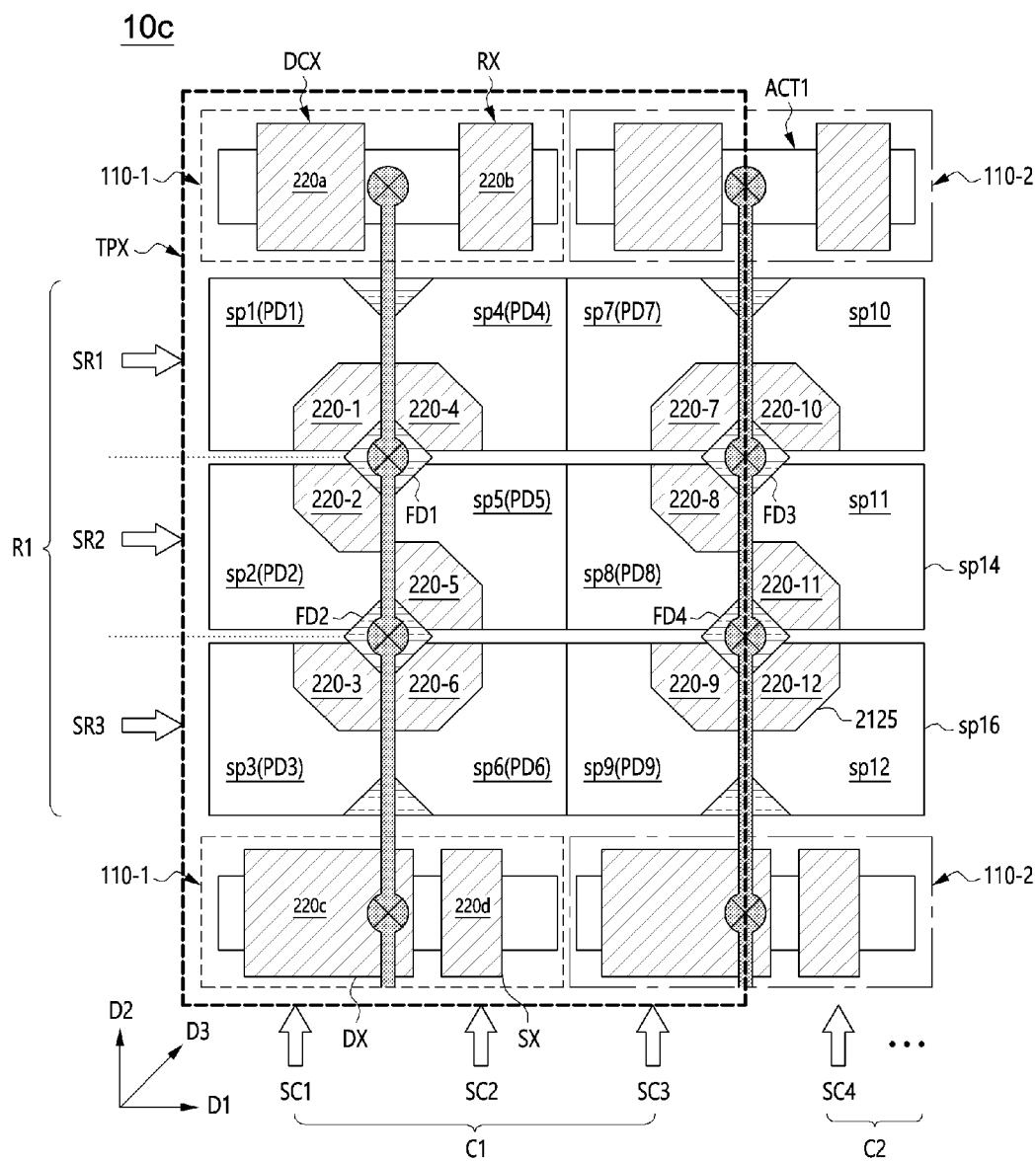
FIG. 9 is a plan view illustrating an expanded pixel group in accordance with example embodiments.
Figure 10:
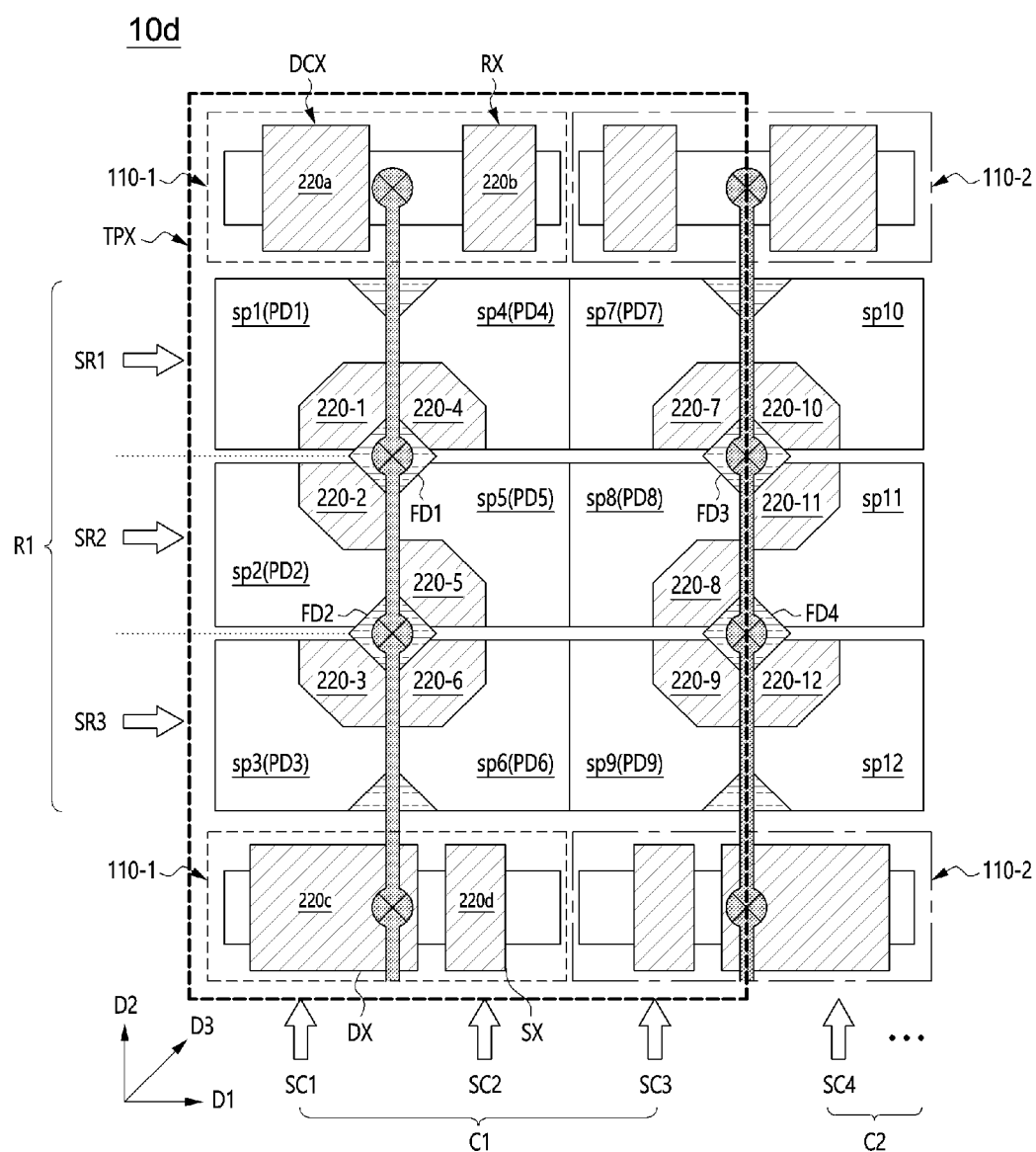
FIG. 10 is a plan view illustrating an expanded pixel group in accordance with example embodiments.
Figure 11:
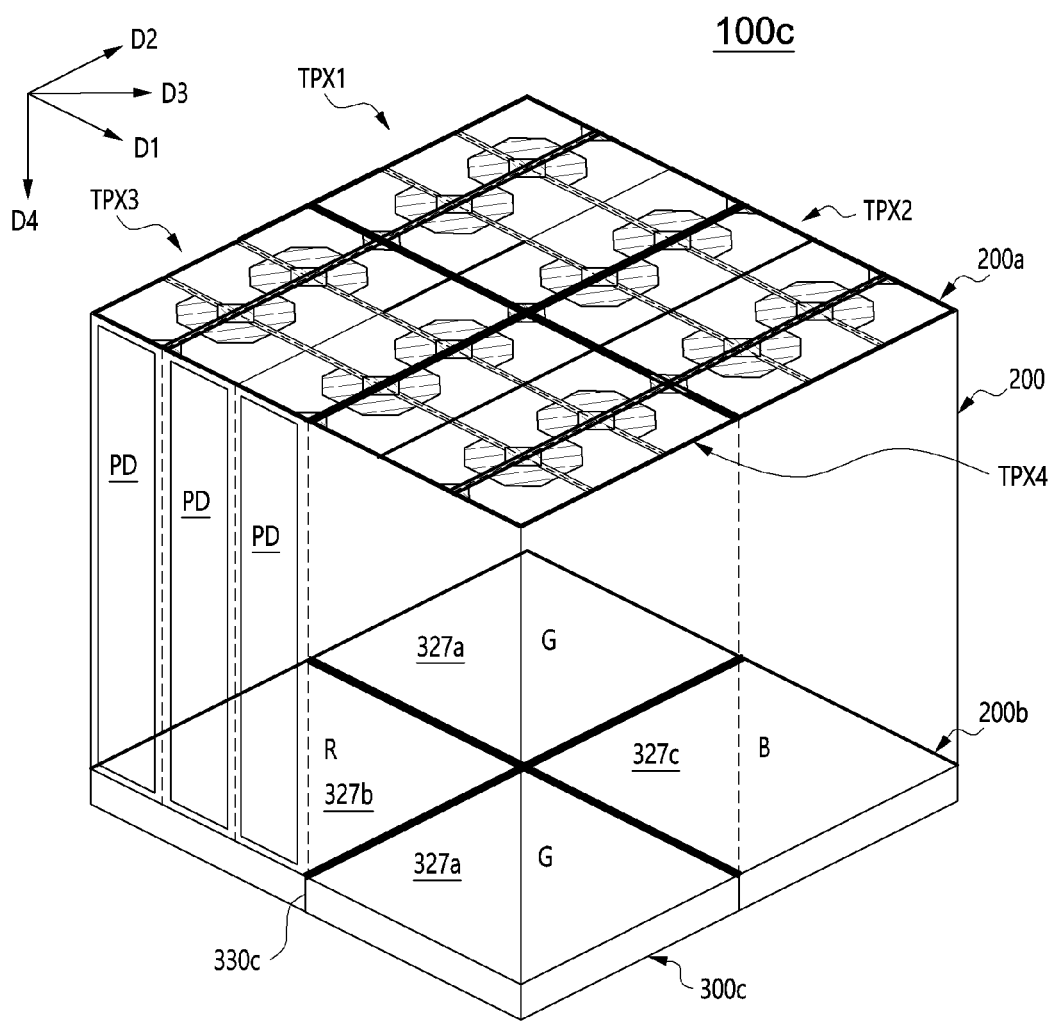
FIG. 11 is a perspective view illustrating an image sensing device with an expanded pixel group and an expanded color filter in accordance with example embodiments.

FIG. 9 is a plan view illustrating an expanded pixel group in accordance with example embodiments, FIG. 10 is a plan view illustrating an expanded pixel group in accordance with example embodiments and FIG. 11 is a perspective view illustrating an image sensing device with an expanded pixel group and an expanded color filter in accordance with example embodiments.

Referring to FIGS. 9 and 11, an image sensing device 100c may include a pixel array 10c and a color filter layer 300c.

The pixel array 10c may include a plurality of expanded pixel groups TPX1-TPX4 arranged in a matrix type.

Each of the expanded pixel group TPX1-TPX4 may include sub-pixels sp1-sp9 larger than the sub-pixels sp1-sp6 of each of the pixel groups PXG in FIG. 5. For example, the expanded pixel group TPX may include an odd number of sub-pixels.

For example, the expanded pixel group TPX may include (3×3) sub-pixels sp1-sp9 arranged between three sub-rows SR1-SR3 and three sub-columns SC1-SC3 intersecting each other.

The first, fourth and seventh sub-pixels sp1, sp4 and sp7 may form the first sub-row SR1. The second, fifth and eighth sub-pixels sp2, sp5 and sp8 may form the second sub-row SR2. The third, sixth and ninth sub-pixels sp3, sp6 and sp9 may form the third sub-row SR3.

The first to third sub-pixels sp1, sp2 and sp3 may form the first sub-column SC1. The fourth to sixth sub-pixels sp4, sp5 and sp6 may form the second sub-column SC2. The seventh to ninth sub-pixels sp7, sp8 and sp9 may form the third sub-column SC3.

The expanded pixel group TPX may include the first to fourth floating diffusions FD1-FD4. The first floating diffusion FD1 may be formed at a contact point between at least three sub-pixels, for example, the first, second, fourth and fifth sub-pixels sp1, sp2, sp4 and sp5. The second floating diffusion FD2 may be formed at a contact point between at least three sub-pixels, for example, the second, third, fifth and sixth sub-pixels sp2, sp3, sp5 and sp6. The third floating diffusion FD3 may be formed at a contact point between the seventh and eighth sub-pixels sp7 and sp8 symmetrically with the first floating diffusion FD1 with respect to a boundary between the second sub-column SC2 and the third sub-column SC3. The fourth floating diffusion FD4 may be formed at a contact point between the eighth and ninth sub-pixels sp8 and sp9 symmetrically with each other with respect to a boundary between the second sub-column SC2 and the third sub-column SC3.

A first transfer gate 220-1 and a second transfer gate 220-2 of the first sub-column SC1 may be configured to surround the first floating diffusion FD1. A third transfer gate 220-3 may be configured to surround the second floating diffusion FD2. The first to third transfer gates 220-1-220-3 may have an arrangement substantially the same as those of the first to third transfer gates 220-1-220-3 in FIG. 5.

A fourth transfer gate 220-4 of the second sub-column SC2 may be configured to surround the first floating diffusion FD1 together with the first and second transfer gates 220-1 and 220-2. Fifth and sixth transfer gates 220-5 and 220-6 may be configured to surround the second floating diffusion FD2 together with the third transfer gate 210-3. The fourth to sixth transfer gates 210-4-210-6 may have an arrangement substantially the same as those of the fourth to sixth transfer gates 220-4-210-6 in FIG. 5.

Seventh to ninth photoelectric conversion units PD7-PD9 and seventh to ninth transfer gates 220-7-220-9 corresponding to the third sub-column SC3 may have arrangements substantially the same as the arrangements of the first to third photoelectric conversion units PD1-PD3 and the first to third transfer gates 220-1-220-3 of the first sub-column SC1. For example, the seventh and eighth transfer gates 220-7 and 220-8 may surround the third floating diffusion FD3. The ninth transfer gate 220-9 may surround the fourth floating diffusion FD4. The expanded pixel group TPX may further include at least one sub-column SC than the pixel group PXG in FIG. 5.

In FIG. 5, tenth to twelfth sub-pixels sp10, sp11 and sp12 corresponding to the fourth sub-column SC4 may be included in the second pixel group PXG2 together with the sub-pixels of the third sub-column SC3. In FIGS. 9 and 10, the tenth to twelfth sub-pixels sp10, sp11 and sp12 corresponding to the fourth sub-column SC4 may be included in another adjacent expanded pixel group TPX. Further, the third and fourth floating diffusions FD3 and FD4 may be commonly shared with different expanded pixel groups TPX.

In example embodiments, the pixel signal generation circuits 110-1 and 110-2 may correspond to each of the pixel groups PXG in FIG. 5. Alternatively, the adjacent two pixel signal generation circuits 110-1 and 110-2 may be co-operated with each other to control one expanded pixel group TPX. Further, the pixel signal generation circuit may be configured to match one expanded pixel group TPX.

The light-receiving region of the (3×3) sub-pixels sp1-sp9 may be symmetrical with respect to the diagonal direction D3 as well as the first and second direction D1 and D23 to provide all area of the expanded pixel group TPX with a uniform light.

Alternatively, as shown in FIG. 10, the pixel array 10d may include the first sub-column SC1 and the second sub-column which are same with those of the pixel array 10c of the FIG. 9. The pixel array 10d may further include the third sub-column SC3 including the photoelectric conversion units PD7-PD9 and the transfer gates 220-7-220-9. The photoelectric conversion units PD7-PD9 and the transfer gates 220-7-220-9 may be folded-symmetrical with the photoelectric conversion units PD4-PD6 of the fourth to sixth sub-pixels sp4-sp6 and the transfer gates 220-4-220-6 of the second sub-column SC2 respect to a boundary between the second and third sub-columns SC2 and SC3. That is, the photoelectric conversion units PD7-PD9 and the transfer gates 220-7-220-9 of the seventh to ninth sub-pixels sp7-sp9 may be symmetrical with the photoelectric conversion units PD4-PD6 and the transfer gates 220-4-220-6 of the fourth to sixth sub-pixels sp4-sp6 by about 180°. Thus, the seventh transfer gate 220-7 may surround the third floating diffusion FD3. The eighth and ninth transfer gates 220-8 and 220-9 may surround the fourth floating diffusion FD4.

Although the arrangements of the transfer gates 220-7-220-9 of the third sub-column SC3 may be changed, the light-receiving region may be uniformly provided in the diagonal direction D3 as well as the first and second directions D1 and D2.

Further, the charges generated in the first and second sub-columns SC1 and SC2 may be converted into the pixel output signal through the pixel signal generation circuit 110-1 of the first pixel group PXG1. The charges generated in the third sub-column SC3 may be converted into the pixel output signal through the pixel signal generation circuit 110-2 of the second pixel group PXG2.

However, in the expanded pixel group TPX of example embodiments, the charges generated in the first and second sub-columns SC1 and SC2 may not be intermediately read through an output node of the first pixel signal generation circuit 110-1 by a binning technology. Binning indicates a technique where the intensities of neighboring pixels on a sensor are combined. In other words, binning is the process of combining charge from adjacent pixels in a CMOS image sensor during readout. In contrast, the charges may be shifted to a register. The charges in the register may be summed up with the charges generated in the third sub-column SC3. The summed charges may be converted into the output signal of the expanded pixel group TPX through the pixel signal generation circuit 110-2 of the second pixel group PXG2. In order to sum the charges of the photoelectric conversion units PD1-PD9 in the expanded pixel group TPX, the first to fourth floating diffusions FD1-FD4 may be electrically connected with each other by a direct or indirect coupling manner. The direct coupling manner may use at least one conductive line. The indirect coupling manner may use shifting the charges by a serial or parallel register. When the pixel output signal of the expanded pixel group TPX may be generated, all signals applied to the tenth to twelfth transfer gates 220-10-220-12 may be disabled to prevent the charges generated in the fourth sub-column SC4, which may correspond to other color filter, from being mixed. The above-mentioned operations may be an example of the binning technologies, not limited thereto.

The color filter layer 300c may be arranged on the second surface 200b of the substrate 200. The color filter layer 300c may include first to third color filters 327a, 327b and 327c and an optical black region 330c. The expanded first to third color filters 327a, 327b and 327c may have a size corresponding to the size of the expanded pixel group TPX.

Particularly, each of the expanded first to third color filters 327a, 327b and 327c may correspond to the (3×3) sub-pixels. Thus, the pixel output signal generated from one expanded pixel group TPX may be a value converted from charges transferred from the nine photoelectric conversion units. According to example embodiments, the area of the pixel group may be controlled regardless of the numbers of the pixel groups corresponding to one color filter. Further, although an even number of sub-pixels or an odd number of sub-pixels may form one group corresponding to one color filter, the light-receiving region may be uniform in all directions.

Furthermore, the charges of the plurality of the sub-pixels may be summed up using the binning technology to improve the characteristics of the high SNR and to provide improved image quality at the night photographing.

Only limited examples of embodiments of the disclosed technology are described or illustrated. Variations and enhancements for the disclosed implementations or embodiments and other implementations or embodiments are possible based on what is disclosed and illustrated in this patent document.

What is claimed is:

1. An image sensing device comprising:
a substrate having a first surface and a second surface opposite to the first surface;
a pixel group including first to ninth sub-pixels arranged at intersections between first to third sub-columns and first to third sub-rows intersecting each other and each sub-pixel structured and operable to convert received light into electrical charge, wherein the first to third sub-pixels are arranged on the first sub-column, the fourth to sixth sub-pixels are arranged on the second sub-column, and the seventh to ninth sub-pixels are arranged on the third sub-column;
a first floating diffusion region arranged at a first location and connected to the first, second, fourth and fifth sub-pixels to receive electrical charge from the first, second, fourth and fifth sub-pixels;
a second floating diffusion region arranged at a second location and connected to the second, third, fifth and sixth sub-pixels to receive electrical charge from the second, third, fifth and sixth sub-pixels;
a third floating diffusion region arranged at a third location between the seventh and eighth sub-pixels, the third location and the first location are arranged symmetrically with the first floating diffusion region with respect to a boundary between the second sub-column and the third sub-column; and
a fourth floating diffusion region arranged at a fourth location between the eighth and ninth sub-pixels, the fourth location and the second location are arranged symmetrically with the second floating diffusion with respect to a boundary between the second sub-column and the third sub-column,
wherein each of the first to ninth sub-pixel comprises:
a transfer gate arranged to surround any one of the first to fourth floating diffusion regions; and
a photoelectric converter structured to convert received light into electrical charge and arranged adjacent to one side of the transfer gate,
wherein each of the first to fourth floating diffusion regions is surrounded by three transfer gates.

2. The image sensing device of claim 1, wherein the first floating diffusion region is surrounded by a first transfer gate in the first sub-pixel, a second transfer gate in the second sub-pixel and a fourth transfer gate in the fourth sub-pixel.

3. The image sensing device of claim 1, wherein the second floating diffusion region is surrounded by a third transfer gate in the third sub-pixel, a fifth transfer gate in the fifth sub-pixel and a sixth transfer gate in the sixth sub-pixel.

4. The image sensing device of claim 1, wherein the third floating diffusion region is surrounded by a seventh transfer gate in the seventh sub-pixel and an eighth transfer gate in the eighth sub-pixel and the fourth floating diffusion region is surrounded by a ninth transfer gate in the ninth sub-pixel.

5. The image sensing device of claim 1, wherein the third floating diffusion region is surrounded by a seventh transfer gate in the seventh sub-pixel and the fourth floating diffusion region is surrounded by an eighth transfer gate in the eighth sub-pixel and a ninth transfer gate in the ninth sub-pixel.

6. The image sensing device of claim 1, wherein the transfer gates on the first to third sub-pixels of the first sub-column have a shape substantially identical to a shape of the transfer gates on the seventh to ninth sub-pixels of the third sub-column.

7. The image sensing device of claim 1, wherein the transfer gates on the fourth to six sub-pixels of the second sub-column have a shape symmetrical with a shape of the transfer gates on the seventh to ninth sub-pixels of the third sub-column with respect to a boundary between the second sub-column and the third sub-column.

8. The image sensing device of claim 1, wherein the first to fourth floating diffusion regions are electrically connected with each other.

9. The image sensing device of claim 1, wherein a pixel signal generation circuit disposed outside the pixel group, wherein the pixel signal generation circuit generates a pixel output signal based on an amount of electric charges generated by the first to fourth floating diffusion regions.

10. The image sensing device of claim 9, wherein the pixel signal generation circuit comprises:
a first active region positioned in a region outside any one of a first sub-row, which includes the first, fourth and seventh sub-pixels, and a third sub-row, which includes the third, sixth and ninth sub-pixels;
a second active region positioned in a region outside a remaining one of the first and third sub-rows;
a reset transistor and a dual conversion transistor arranged in the first active region to share a junction region with each other; and
a drive transistor and a selection transistor arranged in the second active region to share a junction region with each other,
wherein the drive transistor is turned-on based on the amount of the electric charges.

11. The image sensing device of claim 10, wherein the first active region, the first to ninth sub-pixels of the pixel group and the second active region are electrically isolated from each other by at least one isolation structure in the substrate, and any one of the isolation structures is extended to the second surface of the substrate.

12. The image sensing device of claim 1, further comprising a color filter arranged on the second surface of the substrate and having a size corresponding to a size of the pixel group.

13. A image sensing device comprising:
a plurality of pixel groups arranged in a matrix, each of the pixel groups including 3×2 sub pixels; and
first and second floating diffusion regions, each of the first and second floating diffusion regions being arranged between four adjacent sub pixels among the 3×2 sub pixels, wherein three sub pixels of the four adjacent sub pixels share one of the first and second floating diffusion regions,
wherein each of the 3×2 sub pixels includes:
a photoelectric converter structured to convert incident light to generate electrical charge; and
a transfer gate arranged between the photoelectric converter and a selected one of the first and second floating diffusion regions, the transfer gate being adjacent to the selected one of the first and second floating diffusion regions, and
wherein 3×2 transfer gates of the 3×2 sub pixels in the pixel group are arranged symmetrically with respect to a diagonal direction of the pixel group.

14. The image sensing device of claim 13, wherein the first floating diffusion region is adjacent to three transfer gates among the 3×2 transfer gates, and the second floating diffusion region is adjacent to remaining three transfer gates among the 3×2 transfer gates.

15. The image sensing device of claim 13, further comprising a color filter that overlaps with at least one pixel group.

16. A image sensing device comprising:
first to third sub pixels arranged along a column direction;
a first floating diffusion region arranged between the first sub pixel and the second sub pixel, the first floating diffusion region being electrically connected to at least one of the first and second sub pixels; and
a second floating diffusion region arranged between the second sub pixel and the third sub pixel, the second floating diffusion region being electrically connected to the third sub pixel,
wherein a structure of the first sub pixel is symmetrical to a structure of the second sub pixel about a row direction perpendicular to the column direction, and a structure of the third sub pixel is identical to the structure of the second sub pixel.

17. The image sensing device of claim 16, wherein the first sub pixel includes a first photoelectric converter and a first transfer gate arranged between the first photoelectric converter and the first floating diffusion region,
wherein the second sub pixel includes a second photoelectric converter and a second transfer gate arranged between the second photoelectric converter and the first floating diffusion region, and
wherein the third sub pixel includes a third photoelectric converter and a third transfer gate arranged between the third photoelectric converter and the second floating diffusion region.

18. The image sensing device of claim 17, wherein a structure of the first transfer gate is symmetrical to a structure of the second transfer gate about the row direction, and a structure of the third transfer gate is identical to the structure of the second transfer gate.

19. The image sensing device of claim 16, further comprising a color filter that overlaps with the first to third sub pixels.

20. The image sensing device of claim 16, further comprising:
a fourth sub pixel arranged at one side of the first sub pixel to be electrically connected to the first floating diffusion region, wherein a structure of the fourth sub pixel is symmetrical to the structure of the first sub pixel about the column direction;
a fifth sub pixel arranged at one side of the second sub pixel to be electrically connected to the second floating diffusion region, wherein a structure of the fifth sub pixel is symmetrical to the structure of the second sub pixel about a diagonal direction for the row and column directions; and
a sixth sub pixel arranged at one side of the third sub pixel to be electrically connected to the second floating diffusion region, wherein a structure of the sixth sub pixel is symmetrical to the structure of the third sub pixel about the column direction.

* * * * *